(12) United States Patent
Wang et al.

(10) Patent No.: US 9,164,346 B2
(45) Date of Patent: Oct. 20, 2015

(54) ELECTROCHROMIC DEVICES

(71) Applicant: View, Inc., Milpitas, CA (US)

(72) Inventors: Zhongchun Wang, Milpitas, CA (US); Anshu Pradhan, Collierville, TN (US); Robert Rozbicki, Germantown, TN (US)

(73) Assignee: View, Inc., Milpitas, CA (US)

( * ) Notice: Subject to any disclaimer, the term of this patent is extended or adjusted under 35 U.S.C. 154(b) by 0 days.

(21) Appl. No.: 14/209,993

(22) Filed: Mar. 13, 2014

(65) Prior Publication Data

US 2014/0313561 A1    Oct. 23, 2014

Related U.S. Application Data

(63) Continuation of application No. 13/610,684, filed on Sep. 11, 2012, now Pat. No. 8,749,868, which is a continuation of application No. 12/772,075, filed on Apr. 30, 2010, now Pat. No. 8,582,193.

(51) Int. Cl.
*G02F 1/153* (2006.01)
*C25B 11/00* (2006.01)
(Continued)

(52) U.S. Cl.
CPC ............... *G02F 1/153* (2013.01); *G02F 1/155* (2013.01); *G02F 1/1523* (2013.01); *H01J 37/3426* (2013.01); *G02F 1/1508* (2013.01)

(58) Field of Classification Search
CPC ............ G02F 1/15; G02F 1/153; G02F 1/155
USPC ........ 359/265–275, 900; 204/192.15, 192.12, 204/298.26, 298.13; 427/124, 126.3
See application file for complete search history.

(56) References Cited

U.S. PATENT DOCUMENTS 4,293,194 A    10/1981    Takahashi
4,297,006 A    10/1981    Bissar
(Continued)

FOREIGN PATENT DOCUMENTS

EP        0497616        5/1992
JP        S57-81242 A    5/1982
(Continued)

OTHER PUBLICATIONS

US Notice of Allowance dated Mar. 17, 2014 in U.S. Appl. No. 12/814,279.
(Continued)

*Primary Examiner* — Tuyen Tra
(74) *Attorney, Agent, or Firm* — Weaver Austin Villeneuve & Sampson LLP; Brian D. Griedel

(57) ABSTRACT

Conventional electrochromic devices frequently suffer from poor reliability and poor performance. Improvements are made using entirely solid and inorganic materials. Electrochromic devices are fabricated by forming an ion conducting electronically insulating interfacial region that serves as an IC layer. In some methods, the interfacial region is formed after formation of an electrochromic and a counter electrode layer, which are in direct contact with one another. The interfacial region contains an ion conducting electronically insulating material along with components of the electrochromic and/or the counter electrode layer. Materials and microstructure of the electrochromic devices provide improvements in performance and reliability over conventional devices. In addition to the improved electrochromic devices and methods for fabrication, integrated deposition systems for forming such improved devices are also disclosed.

37 Claims, 13 Drawing Sheets

(51) Int. Cl.
*G02F 1/155* (2006.01)
*H01J 37/34* (2006.01)
*G02F 1/15* (2006.01)

(56) References Cited

U.S. PATENT DOCUMENTS

| | | | |
|---|---|---|---|
| 4,482,216 A | 11/1984 | Hashimoto | |
| 4,923,289 A | 5/1990 | Demiryont | |
| 4,938,571 A | 7/1990 | Cogan et al. | |
| 5,019,420 A | 5/1991 | Rauh | |
| 5,138,481 A | 8/1992 | Demiryont | |
| 5,216,536 A | 6/1993 | Agrawal et al. | |
| 5,657,150 A | 8/1997 | Kallman et al. | |
| 5,666,771 A | 9/1997 | Macquart et al. | |
| 5,724,175 A | 3/1998 | Hichwa et al. | |
| 5,724,177 A | 3/1998 | Ellis, Jr. et al. | |
| 5,754,329 A | 5/1998 | Coleman | |
| 5,757,537 A | 5/1998 | Ellis, Jr. et al. | |
| 5,814,195 A | 9/1998 | Lehan et al. | |
| 6,178,034 B1 | 1/2001 | Allemand et al. | |
| 6,277,523 B1 | 8/2001 | Giron | |
| 6,337,758 B1 | 1/2002 | Beteille et al. | |
| 6,515,787 B1 | 2/2003 | Westfall et al. | |
| 6,529,308 B2 | 3/2003 | Beteille et al. | |
| 6,559,411 B2 | 5/2003 | Borgeson et al. | |
| 6,791,737 B2 | 9/2004 | Giron | |
| 6,822,778 B2 | 11/2004 | Westfall et al. | |
| 6,856,444 B2 | 2/2005 | Ingalls et al. | |
| 6,859,297 B2 | 2/2005 | Lee et al. | |
| 6,919,530 B2 | 7/2005 | Borgeson et al. | |
| 6,940,628 B2 | 9/2005 | Giron | |
| 7,193,763 B2 | 3/2007 | Beteille et al. | |
| 7,230,748 B2 | 6/2007 | Giron et al. | |
| 7,265,891 B1 | 9/2007 | Demiryont | |
| 7,277,215 B2 | 10/2007 | Greer | |
| 7,372,610 B2 | 5/2008 | Burdis et al. | |
| 7,531,101 B2 | 5/2009 | Beteille | |
| 7,564,611 B2 | 7/2009 | Jang et al. | |
| 7,593,154 B2 | 9/2009 | Burdis et al. | |
| 7,604,717 B2 | 10/2009 | Beteille et al. | |
| 7,704,555 B2 | 4/2010 | Demiryont | |
| 7,830,585 B2 | 11/2010 | Widjaja et al. | |
| 7,869,114 B2 | 1/2011 | Valentin et al. | |
| 7,894,120 B2 | 2/2011 | Valentin et al. | |
| 8,004,744 B2 | 8/2011 | Burdis et al. | |
| 8,168,265 B2 | 5/2012 | Kwak et al. | |
| 8,228,592 B2 | 7/2012 | Wang et al. | |
| 8,300,298 B2 | 10/2012 | Wang et al. | |
| 8,582,193 B2 | 11/2013 | Wang et al. | |
| 8,749,868 B2 | 6/2014 | Wang et al. | |
| 8,758,575 B2 | 6/2014 | Wang et al. | |
| 8,764,950 B2 | 7/2014 | Wang et al. | |
| 8,764,951 B2 | 7/2014 | Wang et al. | |
| 9,007,674 B2 * | 4/2015 | Kailasam et al. | 359/269 |
| 2003/0156313 A1 | 8/2003 | Serra et al. | |
| 2005/0147825 A1 | 7/2005 | Arnaud et al. | |
| 2007/0008605 A1 | 1/2007 | Garg et al. | |
| 2007/0097481 A1 | 5/2007 | Burdis et al. | |
| 2008/0304130 A1 | 12/2008 | Nguyen | |
| 2009/0057137 A1 | 3/2009 | Pitts et al. | |
| 2009/0285978 A1 | 11/2009 | Burdis et al. | |
| 2009/0323156 A1 | 12/2009 | Shin et al. | |
| 2010/0007937 A1 | 1/2010 | Widjaja et al. | |
| 2010/0165440 A1 | 7/2010 | Nguyen et al. | |
| 2010/0243427 A1 | 9/2010 | Kozlowski et al. | |
| 2010/0245973 A1 | 9/2010 | Wang et al. | |
| 2011/0043885 A1 | 2/2011 | Lamine et al. | |
| 2011/0043886 A1 | 2/2011 | Jeon et al. | |
| 2011/0151283 A1 | 6/2011 | Gillaspie et al. | |
| 2011/0249314 A1 | 10/2011 | Wang et al. | |
| 2011/0266137 A1 | 11/2011 | Wang et al. | |
| 2011/0266138 A1 | 11/2011 | Wang et al. | |
| 2011/0267674 A1 | 11/2011 | Wang et al. | |
| 2011/0267675 A1 | 11/2011 | Wang et al. | |
| 2012/0181167 A1 | 7/2012 | Jiang et al. | |
| 2012/0275008 A1 | 11/2012 | Pradhan et al. | |
| 2013/0003157 A1 | 1/2013 | Wang et al. | |
| 2013/0101751 A1 | 4/2013 | Berland et al. | |
| 2013/0270105 A1 | 10/2013 | Wang et al. | |
| 2014/0177027 A1 | 6/2014 | Wang et al. | |

FOREIGN PATENT DOCUMENTS

| | | |
|---|---|---|
| JP | S58-33223 A | 2/1983 |
| JP | 58-139128 | 8/1983 |
| JP | H03-500096 A | 1/1991 |
| JP | H10-501847 A | 2/1998 |
| JP | 2006-235632 A | 9/2006 |
| JP | 2010-509720 A | 3/2010 |
| WO | WO 2008/055824 | 5/2008 |
| WO | WO 2009/148861 | 12/2009 |
| WO | WO 2012/138281 | 10/2012 |

OTHER PUBLICATIONS

US Office Action dated Aug. 6, 2014 in U.S. Appl. No. 14/052,455.
European Search Report dated May 13, 2014 in EP Application No. 11775488.7.
U.S. Office Action, dated Apr. 26, 2012, issued in U.S. Appl. No. 12/772,055.
U.S. Notice of Allowance, dated Sep. 18, 2012, issued in U.S. Appl. No. 12/772,055.
U.S. Appl. No. 13/627,798, filed Sep. 26, 2012.
US Notice of Allowance dated Feb. 14, 2014 for U.S. Appl. No. 13/627,798.
US Office Action dated Nov. 20, 2012 in U.S. Appl. No. 12/814,277
US Final Office Action dated Jun. 27, 2013 in U.S. Appl. No. 12/814,277.
US Notice of Allowance dated Mar. 12, 2014 in U.S. Appl. No. 12/814,277.
US Office Action dated Nov. 20, 2012 in U.S. Appl. No. 12/814,279.
US Final Office Action dated Jun. 27, 2013 in U.S. Appl. No. 12/814,279.
U.S. Office Action, dated Jan. 20, 2012, issued in U.S. Appl. No. 12/772,075.
U.S. Office Action, dated Aug. 16, 2012, issued in U.S. Appl. No. 12/772,075.
US Office Action dated Dec. 26, 2012 in U.S. Appl. No. 12/772,075.
US Notice of Allowance dated Jul. 10, 2013 in U.S. Appl. No. 12/772,075.
U.S. Office Action, dated Oct. 25, 2011, issued in U.S. Appl. No. 13/166,537.
U.S. Office Action, dated Feb. 16, 2012, issued in U.S. Appl. No. 13/166,537.
U.S. Notice of Allowance, dated May 31, 2012, issued in U.S. Appl. No. 13/166,537.
US Office Action dated Jun. 25, 2013 in U.S. Appl. No. 13/610,684.
US Notice of Allowance dated Jan. 21, 2014 in U.S. Appl. No. 13/610,684.
U.S. Appl. No. 14/052,455, filed Oct. 14, 2013.
Australian Examination Report dated Jan. 6, 2014 in AU Application No. 2011245431.
Mexican Office Action mailed Jun. 6, 2013 in MX Application No. MX/a/2012/012573.
International Search Report and Written Opinion, dated Jul. 7, 2011, issued in PCT/US2011/033822.
International Preliminary Report on Patentability, dated Nov. 15, 2012 in PCT/US2011/033822.
International Search Report and Written Opinion, dated Sep. 14, 2011, issued in PCT/US2011/033906.
International Search Report and Written Opinion, dated Aug. 14, 2013 in PCT/US2013/038481.
Singapore Examination Report dated Nov. 5, 2013 in SG Application No. 201208018-0.
Burdis, et al., "Technology Advancements to Lower Costs of Electrochromic Window Glazings", SAGE Electronics, Inc., DE-PS26-06NT42764, Final Report, Apr. 2, 2010.
Velux SageGlass Flyer, 2007, 4 pages.

(56) References Cited

OTHER PUBLICATIONS

Hersh, H.N., "Mechanism of Electrochromism in WO3," Applied Physics Letters, vol. 27, No. 12, Dec. 15, 1975, pp. 646-648.
Yoshimura, et al., "Electrochromism in a Thin-Film Device Using $Li_2WO_4$ as an Li-Electrolyte", Japanese Journal of Applied Physics, vol. 22, No. 1, Jan. 1983, pp. 152-156.
Vink, et al., "Lithium Trapping at Excess Oxygen in Sputter-Deposited a-WO3 Films", Japanese Journal of Applied Physics, vol. 8, No. 3, Feb. 1, 1999, pp. 1540-1544.
US Office Action dated Jan. 14, 2015 in U.S. Appl. No. 13/462,725.
U.S. Appl. No. 14/683,541, filed Apr. 10, 2015 + preliminary amendment filed Apr. 13, 2015.
US Notice of Allowance dated Jan. 22, 2015 in U.S. Appl. No. 14/052,455.
Chinese Office Action mailed Jan. 8, 2015 in CN Application No. CN201180027892.9.
Japanese Office Action mailed Jan. 6, 2015 in JP Application No. JP2013-508130.
International Preliminary Report on Patentability dated Nov. 15, 2012 in PCT/US2011/033906.
International Preliminary Report on Patentability dated Nov. 13, 2014 in PCT/US2013/038481.
Russian Office Action dated Feb. 25, 2015 in RU Application No. 2012151304.
US Notice of Allowance dated May 11, 2015 in U.S. Appl. No. 14/052,455.
Taiwanese Office Action mailed Jul. 22, 2015 in TW Application No. 100115190.
US Final Office Action dated Jul. 23, 2015 in U.S. Appl. No. 13/462,725.

\* cited by examiner

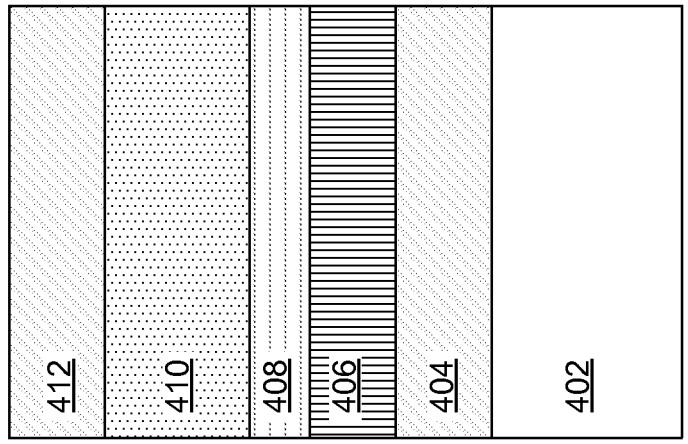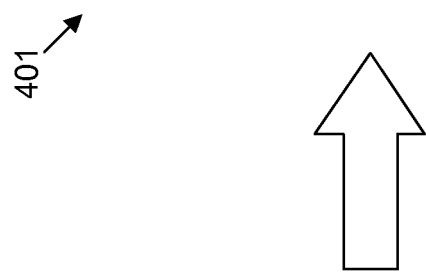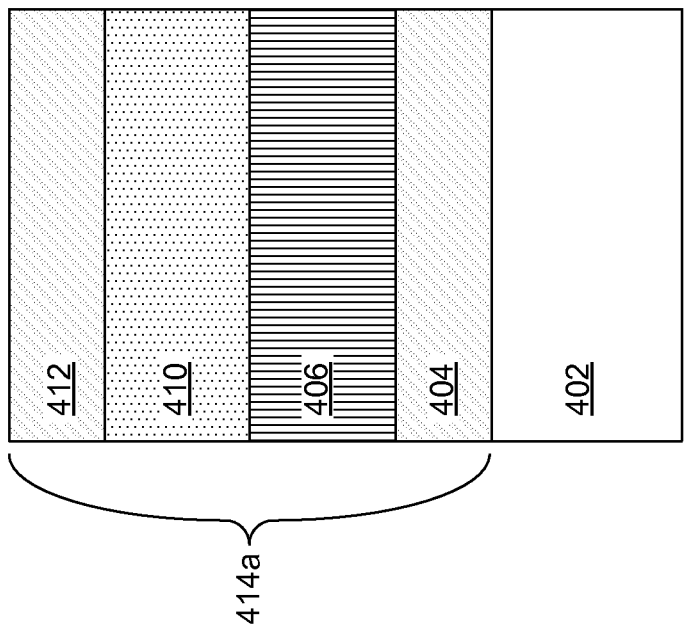
Fig. 4A

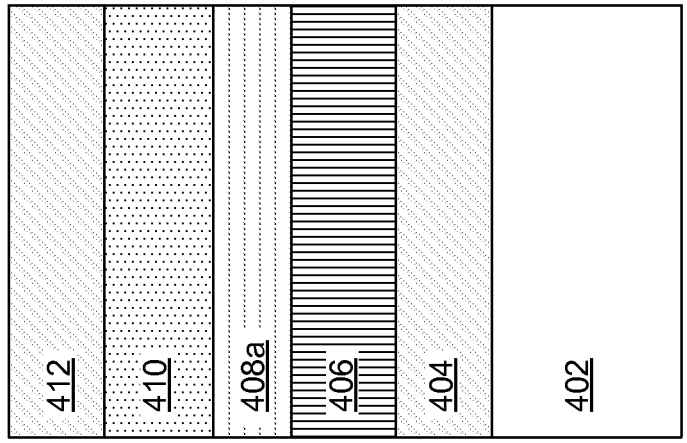
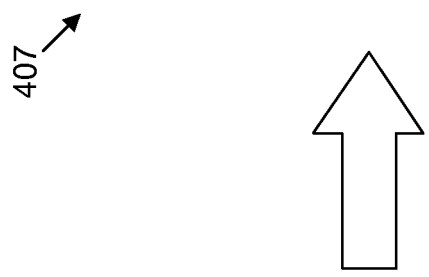
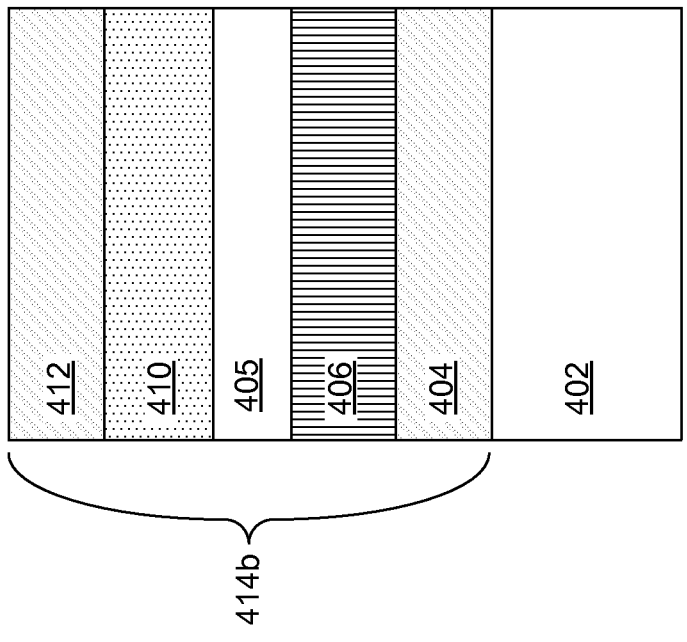
Fig. 4B

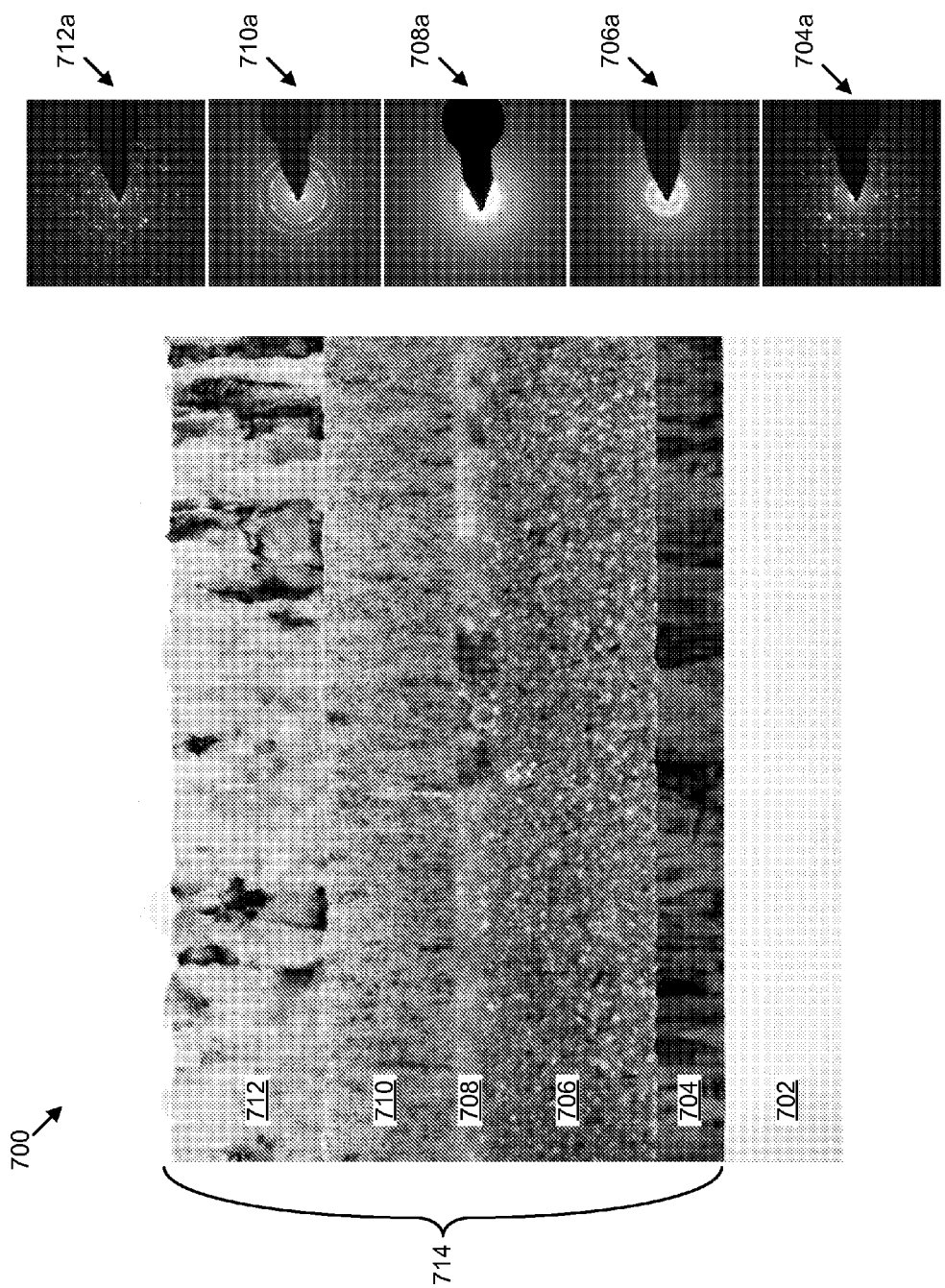

ELECTROCHROMIC DEVICES

CROSS-REFERENCE TO RELATED APPLICATIONS

This application is a continuation of, and claims the benefit of priority to, U.S. patent application Ser. No. 13/610,684, filed Sep. 11, 2012, and titled "Electrochromic Devices," which is a continuation of U.S. patent application Ser. No. 12/772,075, filed Apr. 30, 2010, and titled "Electrochromic Devices," now issued as U.S. Pat. No. 8,582,193, each of which is incorporated herein by reference in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. One well known electrochromic material, for example, is tungsten oxide ($WO_3$). Tungsten oxide is a cathodic electrochromic material in which a coloration transition, transparent to blue, occurs by electrochemical reduction.

Electrochromic materials may be incorporated into, for example, windows and mirrors. The color, transmittance, absorbance, and/or reflectance of such windows and mirrors may be changed by inducing a change in the electrochromic material. One well known application of electrochromic materials, for example, is the rear view mirror in some cars. In these electrochromic rear view mirrors, the reflectivity of the mirror changes at night so that the headlights of other vehicles are not distracting to the driver.

While electrochromism was discovered in the 1960's, electrochromic devices still unfortunately suffer various problems and have not begun to realize their full commercial potential. Advancements in electrochromic technology, apparatus and related methods of making and/or using them, are needed.

SUMMARY OF INVENTION

A typical electrochromic device includes an electrochromic ("EC") electrode layer and a counter electrode ("CE") layer, separated by an ionically conductive ("IC") layer that is highly conductive to ions and highly resistive to electrons. In other words, the ionically conductive layer permits transport of ions but blocks electronic current. As conventionally understood, the ionically conductive layer therefore prevents shorting between the electrochromic layer and the counter electrode layer. The ionically conductive layer allows the electrochromic and counter electrodes to hold a charge and thereby maintain their bleached or colored states. In conventional electrochromic devices, the components form a stack with the ion conducting layer sandwiched between the electrochromic electrode and the counter electrode. The boundaries between these three stack components are defined by abrupt changes in composition and/or microstructure. Thus, the devices have three distinct layers with two abrupt interfaces.

Quite surprisingly, the inventors have discovered that high quality electrochromic devices can be fabricated without depositing an ionically conducting electrically insulating layer. In accordance with certain embodiments, the counter electrode and electrochromic electrodes are formed immediately adjacent one another, often in direct contact, without separately depositing an ionically conducting layer. It is believed that various fabrication processes and/or physical or chemical mechanisms produce an interfacial region between contacting electrochromic and counter electrode layers, and this interfacial region serves at least some functions of an ionically conductive electronically insulating layer in conventional devices. Certain mechanisms that may be key to forming the interfacial region are described below.

The interfacial region typically, though not necessarily, has a heterogeneous structure that includes at least two discrete components represented by different phases and/or compositions. Further, the interfacial region may include a gradient in these two or more discrete components. The gradient may provide, for example, a variable composition, microstructure, resistivity, dopant concentration (for example, oxygen concentration), and/or stoichiometry.

In addition to the above discoveries, the inventors have observed that in order to improve device reliability, two layers of an electrochromic device, the electrochromic (EC) layer and the counter electrode (CE) layer, can each be fabricated to include defined amounts of lithium. Additionally, careful choice of materials and morphology and/or microstructure of some components of the electrochromic device provides improvements in performance and reliability. In some embodiments, all layers of the device are entirely solid and inorganic.

Consistent with above observations and discoveries, the inventors have discovered that formation of the EC-IC-CE stack need not be done in the conventional sequence, EC→IC→CE or CE→IC→EC, but rather an ion conducting electronically insulating region, serving as an IC layer, can be formed after formation of the electrochromic layer and the counter electrode layer. That is, the EC-CE (or CE-EC) stack is formed first, then an interfacial region serving some purposes of an IC layer is formed between the EC and CE layers using components of one or both of the EC and CE layers at the interface of the layers. Methods of the invention not only reduce fabrication complexity and expense by eliminating one or more process steps, but provide devices showing improved performance characteristics.

Thus, one aspect of the invention is a method of fabricating an electrochromic device, the method including: forming an electrochromic layer including an electrochromic material; forming a counter electrode layer in contact with the electrochromic layer without first providing an ion conducting electronically insulating layer between the electrochromic layer and the counter electrode layer; and forming an interfacial region between the electrochromic layer and the counter electrode layer, wherein said interfacial region is substantially ion conducting and substantially electronically insulating. The electrochromic layer and counter electrode layer are typically, but not necessarily, made of one or more materials that are more electronically conductive than the interfacial region but may have some electronically resistive character. The interfacial region can contain component materials of the EC layer and/or the CE layer, and in some embodiments, the EC and CE layers contain component materials of the interfacial region. In one embodiment, the electrochromic layer includes $WO_3$. In some embodiments, the EC layer includes $WO_3$, the CE layer includes nickel tungsten oxide (NiWO), and the IC layer includes lithium tungstate ($Li_2WO_4$).

Heating may be applied during deposition of at least a portion of the electrochromic layer. In one embodiment, where the EC layer includes $WO_3$, heating is applied after each of a series of depositions via sputtering in order to form an EC layer with a substantially polycrystalline microstructure. In one embodiment, the electrochromic layer is between about 300 nm and about 600 nm thick, but the thickness may vary depending upon the desired outcome which contemplates formation of the interfacial region after deposition of the EC-CE stack. In some embodiments, the $WO_3$ is substantially polycrystalline. In some embodiments, an oxygen rich layer of $WO_3$ can be used as a precursor to the interfacial region. In other embodiments the $WO_3$ layer is a graded layer with varying concentrations of oxygen in the layer. In some embodiments, lithium is a preferred ion species for driving the electrochromic transitions, and stack or layer lithiation protocols are described. Specifics of the formation parameters and layer characteristics are described in more detail below.

Another aspect of the invention is a method of fabricating an electrochromic device, the method including: (a) forming either an electrochromic layer including an electrochromic material or a counter electrode layer including a counter electrode material; (b) forming an intermediate layer over the electrochromic layer or the counter electrode layer, where the intermediate layer includes an oxygen rich form of at least one of the electrochromic material, the counter electrode material and an additional material, where the additional material includes distinct electrochromic and/or counter electrode material, the intermediate layer not substantially electronically insulating; (c) forming the other of the electrochromic layer and the counter electrode layer; and (d) allowing at least a portion of the intermediate layer to become substantially electronically insulating and substantially ion conducting. Specifics of the formation parameters and layer characteristics for this method are also described in more detail below.

Another aspect of the invention is an apparatus for fabricating an electrochromic device, including: an integrated deposition system including: (i) a first deposition station containing a material source configured to deposit an electrochromic layer including an electrochromic material; and (ii) a second deposition station configured to deposit a counter electrode layer including a counter electrode material; and a controller containing program instructions for passing the substrate through the first and second deposition stations in a manner that sequentially deposits a stack on the substrate, the stack having an intermediate layer sandwiched in between the electrochromic layer and the counter electrode layer; wherein either or both of the first deposition station and the second deposition station are also configured to deposit the intermediate layer over the electrochromic layer or the counter electrode layer, and where the intermediate layer includes an oxygen rich form of the electrochromic material or the counter electrode material and where the first and second deposition stations are interconnected in series and operable to pass a substrate from one station to the next without exposing the substrate to an external environment. In one embodiment, apparatus of the invention are operable to pass the substrate from one station to the next without breaking vacuum and may include one or more lithiation stations operable to deposit lithium from a lithium-containing material source on one or more layers of the electrochromic device. In one embodiment, apparatus of the invention are operable to deposit the electrochromic stack on an architectural glass substrate. Apparatus of the invention need not have a separate target for fabrication of an ion conducting layer.

Another aspect of the invention is an electrochromic device including: (a) an electrochromic layer including an electrochromic material; (b) a counter electrode layer including a counter electrode material; and (c) an interfacial region between the electrochromic layer and the counter electrode layer, wherein the interfacial region includes an electronically insulating ion conducting material and at least one of the electrochromic material, the counter electrode material and an additional material, where the additional material includes distinct electrochromic and/or counter electrode material. In some embodiments the additional material is not included; in these embodiments the interfacial region includes at least one of the electrochromic material and the counter electrode material. Variations in the composition and morphology and/or microstructure of the interfacial region are described in more detail herein. Electrochromic devices described herein can be incorporated into windows, in one embodiment, architectural glass scale windows.

These and other features and advantages of the invention will be described in further detail below, with reference to the associated drawings.

BRIEF DESCRIPTION OF THE DRAWINGS

The following detailed description can be more fully understood when considered in conjunction with the drawings in which:

FIGS. 4A-4C are schematic cross-sections depicting formation of electrochromic devices in accord with specific embodiments of the invention.

FIGS. 7 and 8A-8C are actual cross-sections of electrochromic devices made using methods in accord with embodiments of the invention.

DETAILED DESCRIPTION

Figure 1A:
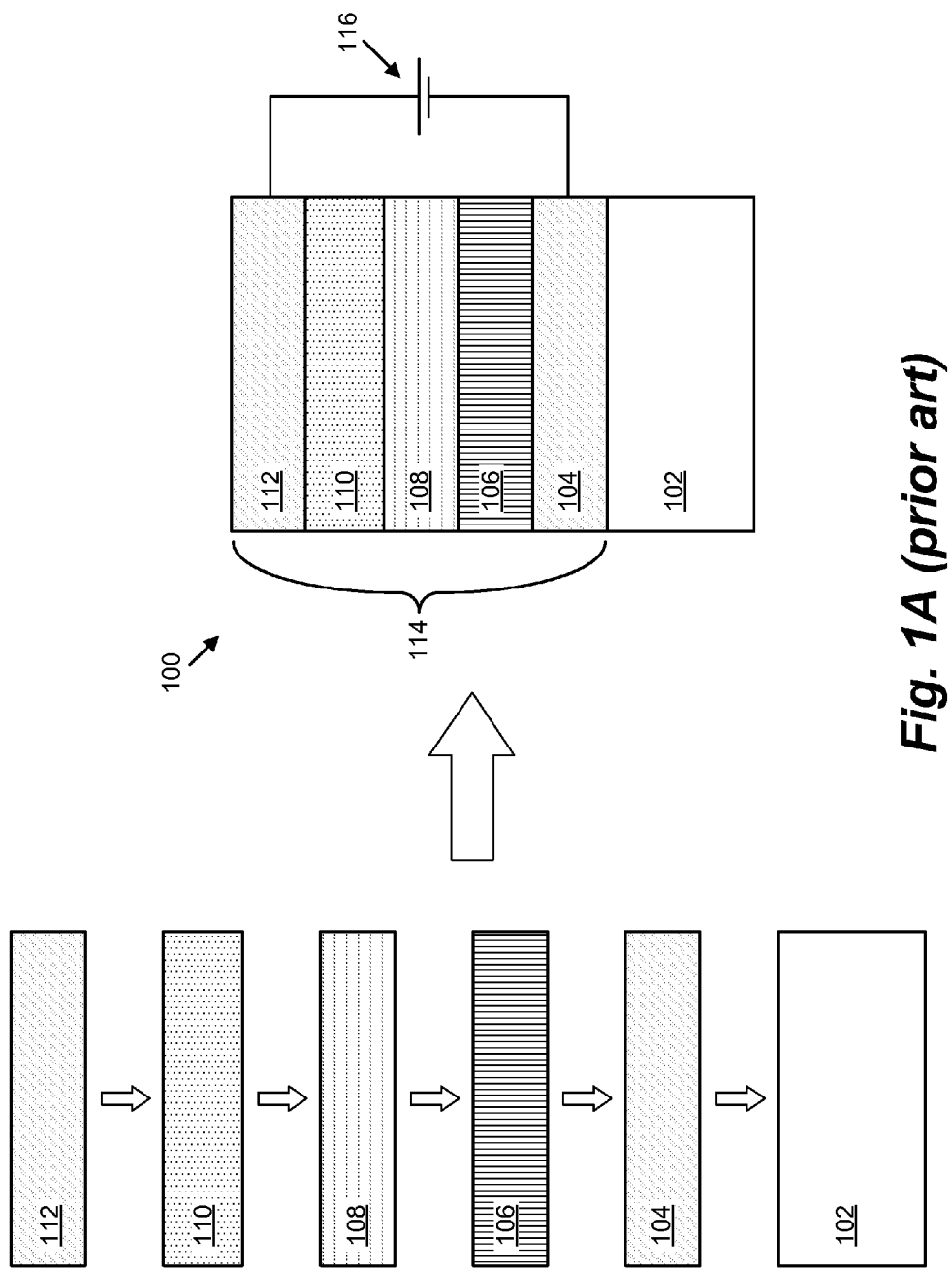
FIG. 1A is a schematic cross-section depicting conventional formation of an electrochromic device stack.

FIG. 1A is a schematic cross-section depicting a conventional electrochromic device stack, 100. Electrochromic device 100 includes a substrate 102, a conductive layer (CL) 104, an electrochromic (EC) layer 106, an ion conducting (IC) layer 108, a counter electrode (CE) layer 110, and a conductive layer (CL) 112. Elements 104, 106, 108, 110, and 112 are collectively referred to as an electrochromic stack 114. Typically, the CL layers are made of a transparent conductive oxide, and are commonly referred to as "TCO" layers. Since the TCO layers are transparent, the coloring behavior of the EC-IC-CE stack is observable through the TCO layers, for example, allowing use of such devices on a window for reversible shading. A voltage source 116, operable to apply an electric potential across electrochromic stack 114, effects the transition of the electrochromic device from, for example, a bleached state (i.e., transparent) to a colored state. The order of the layers may be reversed with respect to the substrate. That is, the layers can be in the following order: substrate, transparent conductive layer, counter electrode layer, ion conducting layer, electrochromic material layer and (another) transparent conductive layer.

Again referring to FIG. 1A, in conventional methods of fabricating an electrochromic stack, the individual layers are deposited one atop the other in a sequential format as depicted in the schematic on the left side of FIG. 1A. That is, TCO layer 104 is deposited on substrate 102. Then EC layer 106 is deposited on TCO 104. Then IC layer 108 is deposited on EC layer 106, followed by deposition of CE layer 110 on IC layer 108, and finally TCO layer 112 on CE layer 110 to form electrochromic device 100. Of course, the order of steps can be reversed to make an "inverted" stack, but the point is that in conventional methods the IC layer is necessarily deposited on the EC layer followed by deposition of the CE layer on the IC layer, or the IC layer is deposited on the CE layer followed by deposition of the EC layer on the IC layer. The transitions between the layers of material in the stack are abrupt.

One notable challenge with above procedure is the processing required to form the IC layer. In some prior approaches it is formed by a sol gel process which is difficult to integrate into a CVD or PVD process employed to form the EC and CE layers. Further, IC layers produced by sol gel and other liquid-based processes are prone to defects that reduce the quality of the device and may need to be removed by, for example, scribing. In other approaches, the IC layer is deposited by PVD from a ceramic target, which can be difficult to fabricate and use.

Figure 1B:
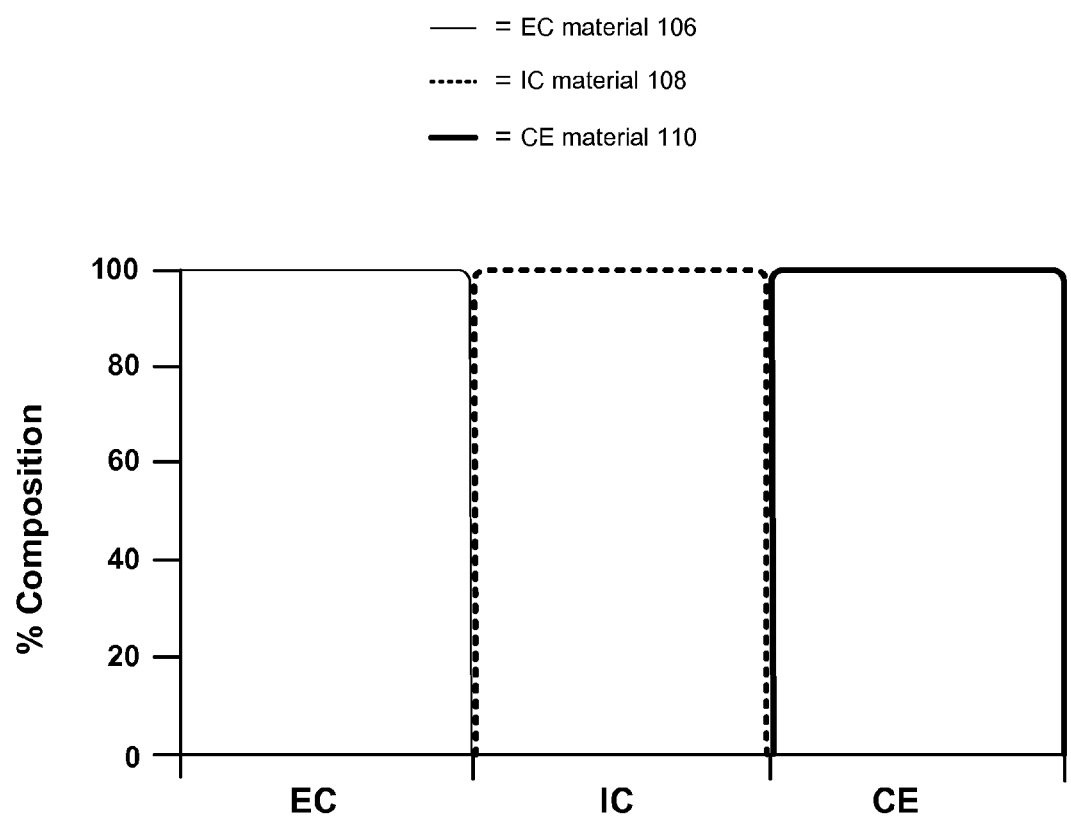
FIG. 1B is a graph showing composition of EC, IC and CE layers in a conventional electrochromic stack.

FIG. 1B is a graph depicting material % composition versus position in the electrochromic stack of FIG. 1A, namely layers 106, 108 and 110, that is, the EC, IC and CE layers. As mentioned, in conventional electrochromic stacks, the transitions between the layers of material in the stack are abrupt. For example, EC material 106 is deposited as a distinct layer with little or no compositional bleed over to the adjacent IC layer. Similarly, IC material 108 and CE material 110 are compositionally distinct with little or no bleed over to adjacent layers. Thus, the materials are substantially homogeneous (except for certain compositions of CE material described below) with abrupt interfaces. Conventional wisdom was that each of the three layers should be laid down as distinct, uniformly deposited and smooth layers to form a stack. The interface between each layer should be "clean" where there is little intermixing of materials from each layer at the interface.

One of ordinary skill in the art would recognize that FIG. 1B is an idealized depiction, and that in a practical sense there is inevitably some degree of material mixing at layer interfaces. The point is, in conventional fabrication methods any such mixing is unintentional and minimal. The inventors have found that interfacial regions serving as IC layers can be formed where the interfacial region includes significant quantities of one or more electrochromic and/or counter electrode materials by design. This is a radical departure from conventional fabrication methods.

As mentioned above, the inventors have discovered that formation of the EC-IC-CE stack need not be conducted in the conventional sequence, EC→IC→CE or CE→IC→EC, but rather an interfacial region serving as the ion conducting layer can be formed after deposition of the electrochromic layer and the counter electrode layer. That is, the EC-CE (or CE-EC) stack is formed first, then an interfacial region, which may possess at least some functions of an IC layer, is formed between the EC and CE layers using components of one or both of the layers (and or another electrochromic or counter electrode material in some embodiments) at the interface of the layers. The interfacial region serves at least some function of a conventional IC layer because it is substantially ion conducting and substantially electronically insulating. It should be noted, however, that interfacial regions as described can have higher than conventionally accepted leakage currents but the devices show good performance nonetheless.

In one embodiment the electrochromic layer is formed with an oxygen rich region which is converted to the interfacial region or layer serving as an IC layer upon subsequent processing after the counter electrode layer is deposited. In some embodiments, a distinct layer which includes an oxygen rich version of an electrochromic material is used to (ultimately) form an interfacial layer serving as an IC layer between the EC and CE layers. In other embodiments, a distinct layer which includes an oxygen rich version of a counter electrode material is used to (ultimately) form an interfacial region serving as an IC layer between the EC and CE layers. All or a portion of the oxygen rich CE layer is converted to the interfacial region. In yet other embodiments, a distinct layer which includes an oxygen rich version of a counter electrode material and an oxygen rich form of an electrochromic material is used to (ultimately) form an interfacial region serving as an IC layer between the EC and CE layers. In other words, some or all of oxygen rich material serves as a precursor to the interfacial region that serves as an IC layer. Methods of the invention can not only reduce process steps, but produce electrochromic devices showing improved performance characteristics.

As mentioned, it is believed that some of the EC and/or CE layer in an interfacial region is converted to a material that provides one or more functions of an IC layer, notably high conductivity for ions and high resistivity for electrons. The IC functional material in the interfacial region may be, for example, a salt of the conductive cations; for example, a lithium salt.

Figure 2A:
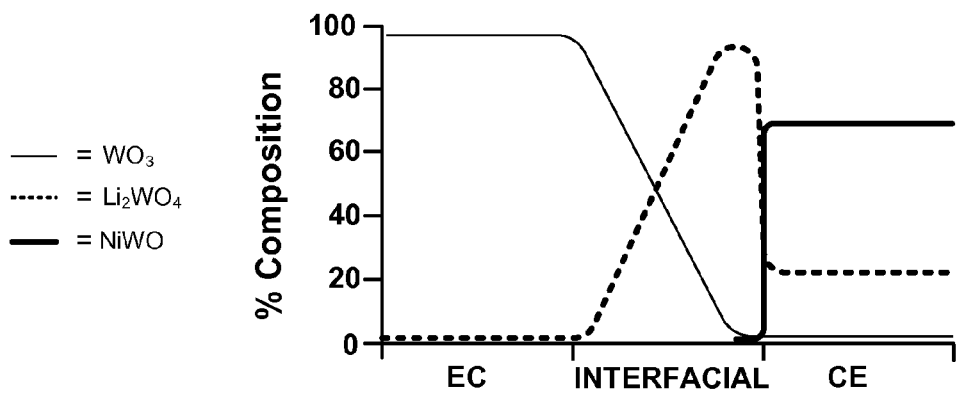
FIGS. 2A-2C are graphs showing representative component compositions for electrochromic devices of the invention.
Figure 2B:
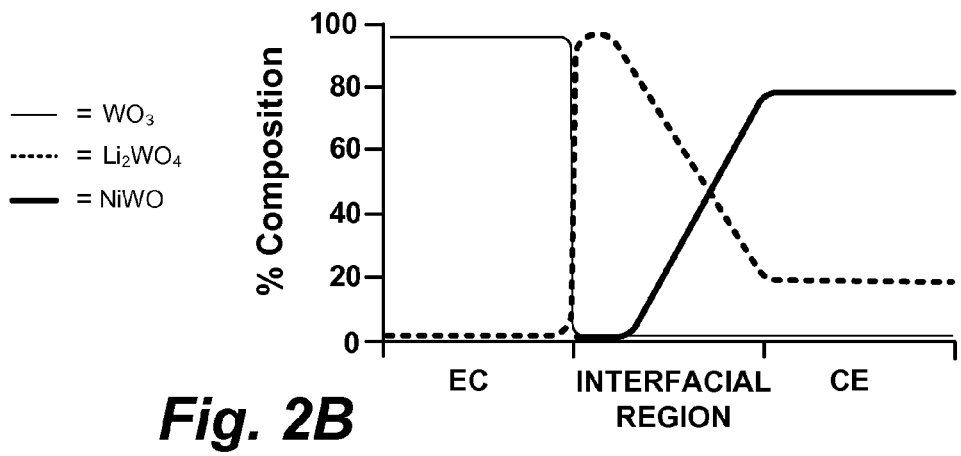
Figure 2C:
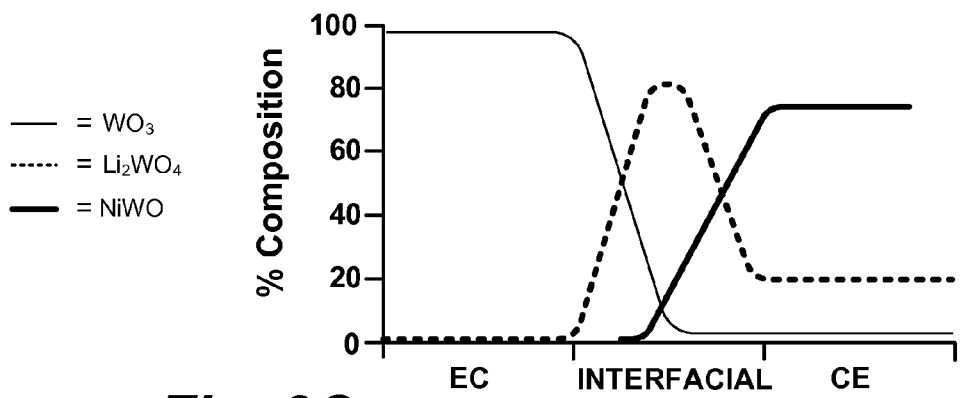

FIGS. 2A, 2B and 2C show composition graphs of three possible examples of electrochromic device stacks (each containing an EC layer, a CE layer and an interfacial region serving as an IC layer), where the EC material is tungsten oxide (denoted here as $WO_3$, but meant to include $WO_x$, where x is between about 2.7 and about 3.5, in one embodiment x is between about 2.7 and about 2.9), the CE material is nickel tungsten oxide (NiWO) and the interfacial region primarily comprises lithium tungstate (denoted here as $Li_2WO_4$, in another embodiment, the interfacial region is a nanocomposite of between about 0.5 and about 50 (atomic) % $Li_2O$, between about 5 and about 95% $Li_2WO_4$, and about 5 and about 70% $WO_3$) with some amount of the EC and/or the CE material. In more general terms, the interfacial region typically, though not necessarily, has a heterogeneous structure that includes at least two discrete components represented by different phases and/or compositions, which phases or compositions vary in concentration over the width of the interfacial region. Because of this the interfacial region that serves as an IC layer is sometimes referred to herein as a "gradient region," a "heterogeneous IC layer" or a "dispersed IC layer." The illustrations in FIGS. 2A, 2B and 2C, although described in terms of specific materials, are more generally representative of composition variations of any suitable materials for electrochromic devices of the invention.

FIG. 2A depicts an electrochromic stack of the invention where the EC material is a significant component of the interfacial region that functions as an IC layer, while the CE material is not a significant component. Referring to FIG. 2A, starting at the origin and moving from left to right along the x-axis, one can see that a portion the EC material, $WO_3$, which is substantially all tungsten oxide, serves as the EC layer. There is a transition into the interfacial region where there is gradually less tungsten oxide and correspondingly gradually more of lithium tungstate, up to and including near the end of the interfacial region where there is a portion that is substantially all lithium tungstate with some minor amounts of tungsten oxide. Although the transition from the EC layer to the interfacial region is demarked at a composition of substantially all tungsten oxide and de minimus amounts of lithium tungstate, it is clear that the transition is not abrupt as in conventional devices. In this example, effectively the transition begins to occur where the composition has sufficient quantity of lithium tungstate to enable the material to serve at least some functions of an IC layer, for example, ion conduction and electronic insulation. Certainly the composition much closer to the CE layer, where the composition is substantially lithium tungstate, serves the function of an IC layer, as lithium tungstate is known to exhibit these properties. But there is also some IC layer function in other parts of interfacial region. The inventors have found that such "heterogeneous IC layers" improve switching characteristics and perhaps thermal cycling stability of electrochromic devices as compared to conventional devices with abrupt transitions. The CE layer in this example contains primarily nickel tungsten oxide as the active material, and has a relatively abrupt transition to the nickel tungsten oxide composition at the edge of the interfacial region. Methods for making stacks with such interfacial regions are described in more detail below.

It should be noted that, for example, that the nickel tungsten oxide CE layer in FIG. 2A is depicted as having about 20% lithium tungstate. Without wishing to be bound by theory, it is believed that the nickel tungsten oxide CE layer exists as nickel oxide cores or particles surrounded by a shell or matrix of lithium tungstate which imparts moderately good ionic conductivity to the CE layer, and thereby aids in the electrochromic transition of the CE layer during operation of the electrochromic stack. The exact stoichiometry of lithium tungstate in the CE layer may vary significantly from embodiment to embodiment. In some embodiments, there may also be some tungsten oxide in the CE layer. Also, because lithium ions travel to and from the EC and CE layers via the interfacial region serving as the IC layer, there may be significant amounts of lithium tungstate in the EC layer, for example as depicted in FIG. 2A.

FIG. 2B depicts an electrochromic stack of the invention where the CE material is a significant component of the interfacial region that functions as an IC layer, while the EC material is not a significant component. Referring to FIG. 2B, starting at the origin and moving from left to right along the x-axis, one can see that in this case, the EC material, which is substantially all tungsten oxide, serves as the EC layer. There is an abrupt transition into the interfacial region where there is little if any tungsten oxide, but there is a large amount of lithium tungstate and at least some nickel tungsten oxide (CE material). The composition of the interfacial region changes along the x-axis with progressively less and less lithium tungstate and correspondingly more and more nickel tungsten oxide. The transition from the interfacial region to the CE layer is demarked arbitrarily at a composition of about 80% nickel tungsten oxide and about 20% of lithium tungstate, but this is merely an example of where the transition occurs in a graded composition. The interfacial region may be viewed as ending when no, or little, additional change in composition occurs when progressing further through the stack. In addition, the transition effectively ends where the composition has sufficient quantity of nickel tungsten oxide such that the material no longer serves at least some function that a distinct IC layer would serve. Certainly the composition much closer to the CE layer as demarked, where the composition is 80% nickel tungsten oxide, serves the function of a CE layer. Likewise, the composition of the interfacial region much closer to the EC layer, where lithium tungstate is the substantial component, serves as an ion conducting electronically insulating material.

FIG. 2C depicts an electrochromic stack of the invention where both the EC material and the CE material are significant components of the interfacial region that functions as an IC layer. Referring to FIG. 2C, starting at the origin and moving from left to right along the x-axis, one can see that a portion the EC material, $WO_3$, which is substantially all tungsten oxide, serves as the EC layer. There is a transition into the interfacial region where there is gradually less tungsten oxide and correspondingly gradually more lithium tungstate. In this example, about a third of the way through what is demarked as the interfacial region, there is also a growing amount of nickel tungsten oxide counter electrode material. At about midway through what is demarked as the interfacial region, there is about 10% each of tungsten oxide and nickel tungsten oxide and 80% lithium tungstate. In this example there is no abrupt transition between an EC layer and an IC layer or between an IC layer and a CE layer, but rather an interfacial region which has a continuous graded composition of both the CE and EC materials. In this example, the lithium tungstate component peaks at about half way through the interfacial region, and so this region is likely the strongest electronically insulating portion of the interfacial region.

As mentioned above in the Summary of Invention, the EC and CE layers may include material components that impart some electrical resistivity to the EC and CE layers; the lithium tungstate in described in FIGS. 2A-2C that spans all three regions, at least in some quantity, is an example of such materials that impart electrical resistivity to the EC and CE layers.

FIGS. 2A-2C represent only three non-limiting examples of graded compositions of interfacial regions that serve as IC layers in electrochromic devices of the invention. One of ordinary skill in the art would appreciate that many variations are possible without escaping the scope of the invention. In each of the examples in FIGS. 2A-2C there is at least one layer where there are only two material components and one of the components is de minimus. The invention is not limited in this way. Thus, one embodiment of the invention is an electrochromic device including a electrochromic layer, an interfacial region serving as an IC layer, and a counter electrode layer, wherein at least one material component of each of the aforementioned two layers and one region of the device is present in each of the electrochromic layer, the interfacial region and the counter electrode layer in at least about 25% by weight, in another embodiment at least about 15% by weight, in another embodiment at least about 10% by weight, in another embodiment at least about 5% by weight, in yet another embodiment at least about 2% by weight.

The amount of electrochromic and/or counter electrode material in the interfacial region can be significant, in one embodiment as much as 50% by weight of the interfacial region. However, in many embodiments, the ion-conducting electrically-insulating material is typically the majority component, while the remainder of the interfacial region is electrochromic and/or counter electrode material. In one embodiment, the interfacial region includes between about 60% by weight and about 95% by weight of the ion-conducting electrically-insulating material while the remainder of the interfacial region is electrochromic and/or counter electrode material. In one embodiment, the interfacial region includes between about 70% by weight and about 95% by weight of the ion-conducting electrically-insulating material while the remainder of the interfacial region is electrochromic and/or counter electrode material. In one embodiment, the interfacial region includes between about 80% by weight and about 95% by weight of the ion-conducting electrically-insulating material while the remainder of the interfacial region is electrochromic and/or counter electrode material.

In some embodiments, interfacial regions in devices described herein may be relatively distinct, that is, when analyzed, for example by microscopy, there are relatively distinguishable boundaries at adjoining layers, even though the interfacial region contains amounts of the electrochromic and/or counter electrode material. In such embodiments the interfacial region's thickness can be measured. In embodiments where the interfacial region is formed from an oxygen-rich (super-stoichiometric) region of an EC and/or CE layer, the ratio of the thickness of the interfacial region as compared to the layer or layers it is formed from is one metric for characterizing the interfacial region. For example, an electrochromic layer is deposited with an oxygen-rich upper layer. The EC layer may include a single metal oxide or two or more metal oxides mixed homogenously or heterogeneously in layers or more diffuse regions. The EC layer is 550 nm thick, including the oxygen-rich layer (or region). If about 150 nm of the EC layer is converted to interfacial region, then about 27% of the EC is converted to interfacial region, that is, 150 nm divided by 550 nm. In another example, the EC layer includes a first metal oxide region (or layer) and a second metal oxide layer (or region) that is oxygen-rich. If all or a portion of the oxygen-rich metal oxide layer is converted to interfacial region, then the thickness of the interfacial region divided by the total thickness of the first and second metal oxide layers (prior to formation of the interfacial region) is a metric for the interfacial region. In one embodiment, the interfacial region includes between about 0.5% and about 50% by thickness of a precursor region (EC and/or CE, including oxygen-rich portion) used to form it, in another embodiment, between about 1% and about 30%, in yet another embodiment, between about 2% and about 10%, and in another embodiment between about 3% and about 7%.

The inventors have discovered that graded compositions serving as the IC layer have many benefits. While not wishing to be bound by theory, it is believed that by having such graded regions, the efficiency of the electrochromic transitions is improved dramatically. There are other benefits as described in more detail below.

While not wishing to be bound to theory, it is believed that one or more of the following mechanisms may affect the transformation of EC and/or CE material to an IC functioning material in the interfacial region. However, the performance or application of the invention is not limited to any of these mechanisms. Each of these mechanisms is consistent with a process in which IC layer material is never deposited during fabrication of the stack. As is made clear elsewhere herein, apparatus of the invention need not have a separate target comprising material for an IC layer.

In a first mechanism, the direct lithiation of the electrochromic material or the counter electrode material produces an IC material (for example, a lithium tungstate) in the interfacial region. As explained more fully below various embodiments employ direct lithiation of one of the active layers at a point in the fabrication process between the formation of the EC and CE layers. This operation involves exposure of the EC or CE layer (whichever is formed first) to lithium. According to this mechanism, a flux of lithium passing through the EC or CE layer produces an ionically conductive, electronically resistive material such as a lithium salt. Heating or other energy can be applied to drive this flux of lithium. This described mechanism converts the top or exposed portion of the first formed layer (EC or CE layer) prior to formation of the second layer (CE or EC layer).

In a second mechanism, lithium diffusing from one of the EC or CE to the other layer, after both layers have formed and/or during formation of a second layer upon a lithiated first layer, causes conversion of part of one of the EC and/or CE at their interface to the interfacial region having the IC functioning material. The lithium diffusion may take place after all the second layer has formed or after only some fraction of the second layer has formed. Further, the diffusion of lithium and consequent conversion to IC functional material take place in either the first or second deposited layers and in either the EC or CE layer. In one example, the EC layer is formed first and then lithiated. As the CE layer is subsequently deposited on top of the EC layer, some lithium diffuses from the underlying EC layer toward and/or into the CE layer causing a transformation to an interfacial region which contains an IC functioning material. In another example, the EC layer formed first (optionally with an oxygen rich upper region), then the CE layer is formed and lithiated. Subsequently some lithium from the CE layer diffuses into the EC layer where it forms the interfacial region having the IC functioning material. In yet another example, the EC layer is deposited first and then lithiated to produce some IC functioning material according to first the mechanism described above. Then, when the CE layer is formed, some lithium diffuses from the underlying EC layer toward the CE layer to produce some IC material in an interfacial region of the CE layer. In this manner, the IC functioning material nominally resides in both the CE and EC layers proximate their interface.

In a third mechanism, the EC and CE layers are formed to completion (or at least to the point where the second formed layer is partially complete). Then, the device structure is heated and the heating converts at least some of the material in the interfacial region to an IC functioning material (for example, a lithium salt). Heating, for example as part of a multistep thermochemical conditioning (MTCC) as described further herein, may be performed during deposition or after deposition is completed. In one embodiment, the heating is performed after a transparent conductive oxide is formed on the stack. In another embodiment, heating is applied after the second layer is partially or wholly complete, but before a transparent conductive oxide is applied thereto. In some cases, the heating is directly and primarily responsible for the transformation. In other cases, the heating primarily facilitates the diffusion or flux of lithium ions that creates the IC-functioning material region as described in the second mechanism.

Finally, in a fourth mechanism, current flowing between the EC and CE layers drives the transformation of at least one of the electrochromic material and the counter electrode material to the IC-functioning material in the interfacial region. This may occur because, for example, an ion flux associated with the flowing current is so large it drives a chemical transformation of EC and/or CE material to IC material in the interfacial region. For example, as explained below, a large lithium flux through tungsten oxide in an EC layer may produce lithium tungstate, which serves as an IC material. The lithium flux may be introduced during, for example, an initial activation cycle of a newly formed device. However, this need not be the case, as other opportunities for driving high ionic fluxes may be more appropriate for effecting the conversion. Methods of the invention can be performed by one of ordinary skill in the art without resort to any one or more of the above mechanisms.

Figure 3A:
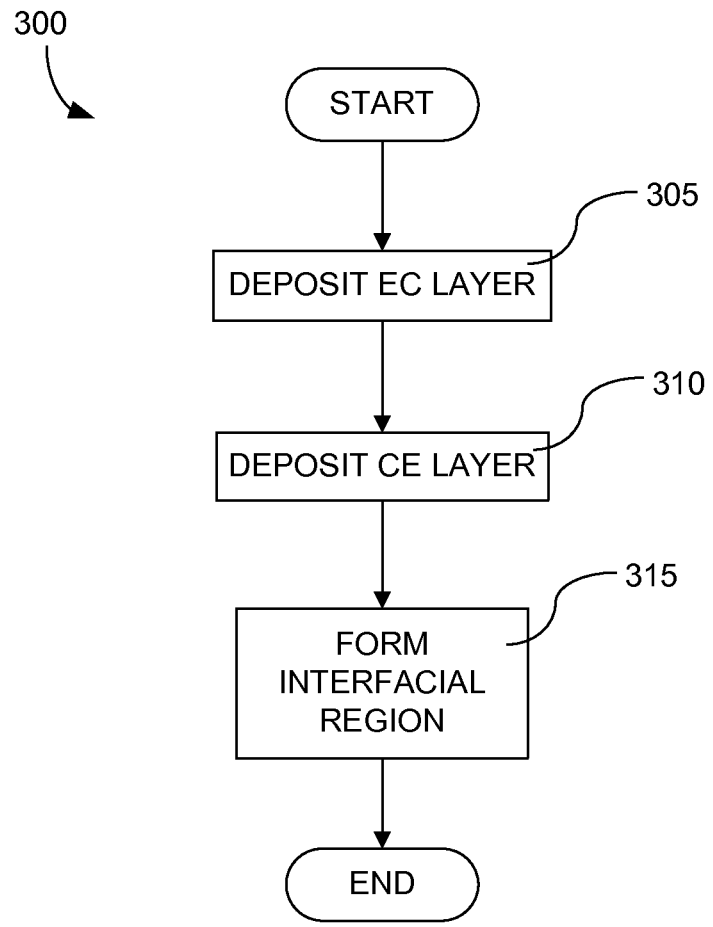
FIGS. 3A and 3B are process flows in accord with embodiments of the invention.

FIG. 3A is a process flow, 300, in accord with methods of the invention. Specifically, an EC layer is deposited (on a CL, for example a TCO), see 305. Then a CE layer is deposited, see 310. After the EC and CE layers are deposited, then an interfacial region serving as an IC layer is formed therebetween, see 315. One embodiment of the invention is an analogous method (not depicted) where steps 305 and 310 are reversed. The thrust of the method being that the interfacial region, functioning as an IC layer, is formed after the EC and CE layers, in some embodiments using at least part of one of the EC and CE layers to make the interfacial region. For this reason, interfacial regions formed in this way are sometimes referred to as "intrinsic" IC layers. In other embodiments a distinct layer is formed between the EC and CE layers, for example using an oxygen-enriched version of the EC material or the CE material, where the layer is converted whole or in part to the interfacial region, but again, after formation of the EC and CE layers. Various methods to form the interfacial region after the EC-CE stack is formed are described below.

Thus, as mentioned, one aspect of the invention is a method of fabricating an electrochromic device, the method including: forming an electrochromic layer including an electrochromic material; forming a counter electrode layer in contact with the electrochromic layer without first providing an ion conducting electronically insulating layer between the electrochromic layer and the counter electrode layer, wherein the counter electrode layer includes a counter electrode material; and forming an interfacial region between the electrochromic layer and the counter electrode layer, wherein said interfacial region is substantially ion conducting and substantially electronically insulating. The interfacial region can contain component materials of the EC layer, the CE layer or both. The interfacial region can be formed in a number of ways, as described in more detail below.

Figure 3B:
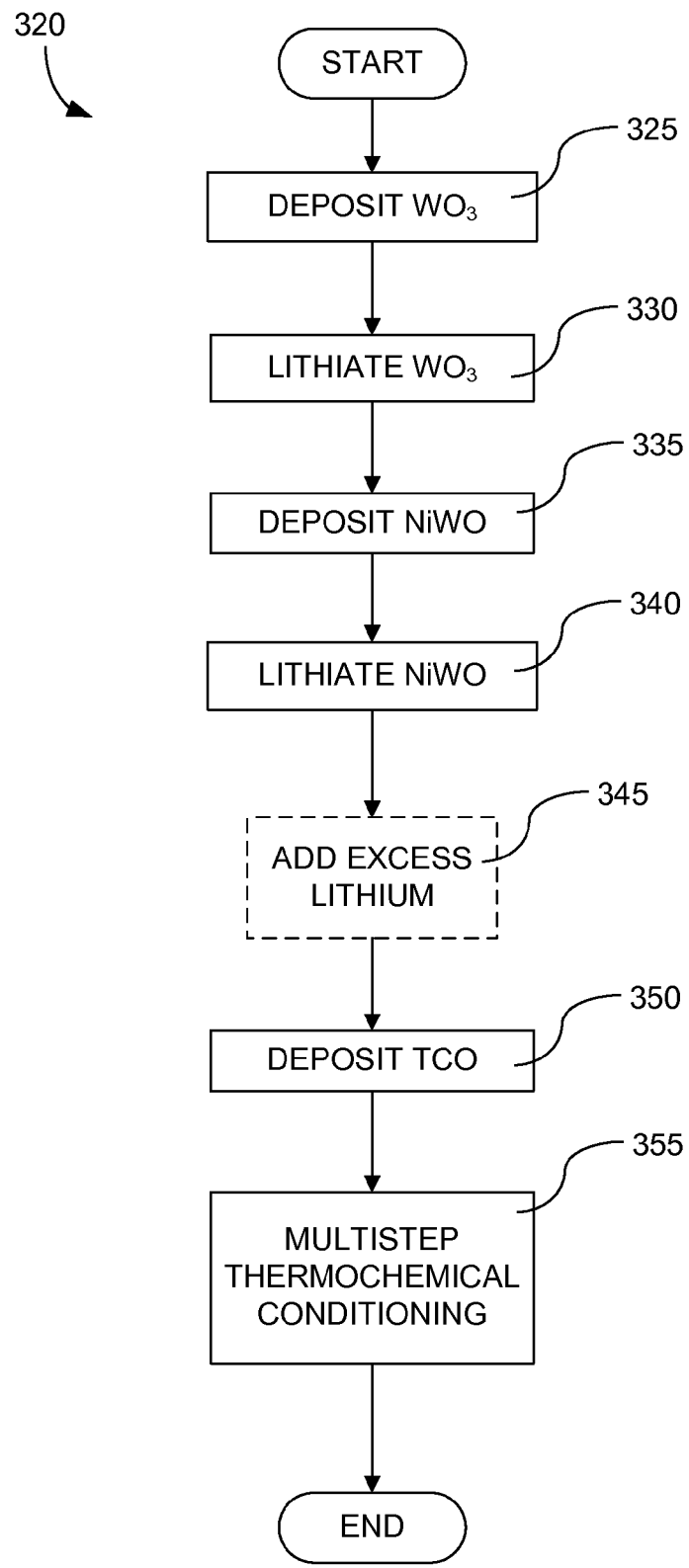

FIG. 3B is a process flow, 320, showing a process flow in accord with the method described in relation to FIG. 3A, in particular, a process flow for depositing an EC layer, then a CE layer and ultimately forming an interfacial region, functioning as an IC layer therebetween. Even more particularly, in this embodiment, the EC layer includes $WO_3$ with various amounts of oxygen, in particular compositions and configurations; the CE layer includes NiWO, the interfacial region includes $Li_2WO_4$, and TCO materials such as indium tin oxide and fluorinated tin oxide are used. It should be noted that the layers of the electrochromic devices are described below in terms of solid state materials. Solid state materials are desirable because of reliability, consistent characteristics and process parameters and device performance. Exemplary solid state electrochromic devices, methods and apparatus for making them and methods of making electrochromic windows with such devices are described in U.S. Non-provisional patent application Ser. No. 12/645,111, entitled "Fabrication of Low Defectivity Electrochromic Devices," by Kozlowski et al., and U.S. Non-provisional patent application Ser. No. 12/645,159, entitled "Electrochromic Devices," by Wang et al., both of which are incorporated by reference herein for all purposes. In particular embodiments, the electrochromic devices of the invention are all solid state and made in apparatus that allow deposition of one or more layers of the stack in a controlled ambient environment. That is, in apparatus where the layers are deposited without leaving the apparatus and without, for example, breaking vacuum between deposition steps, thereby reducing contaminants and ultimately device performance. In a particular embodiment, apparatus of the invention do not require a separate target for depositing an IC layer, as is required in conventional apparatus. As one of ordinary skill in the art would appreciate, the invention is not limited to these materials and methods, however, in certain embodiments, all of the materials making up electrochromic stacks and precursor stacks (as described below) are inorganic, solid (i.e., in the solid state), or both inorganic and solid.

Because organic materials tend to degrade over time, for example when exposed to ultraviolet light and heat associated with window applications, inorganic materials offer the advantage of a reliable electrochromic stack that can function for extended periods of time. Materials in the solid state also offer the advantage of not having containment and leakage issues, as materials in the liquid state often do. It should be understood that any one or more of the layers in the stack may contain some amount of organic material, but in many implementations one or more of the layers contains little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Figure 4C:
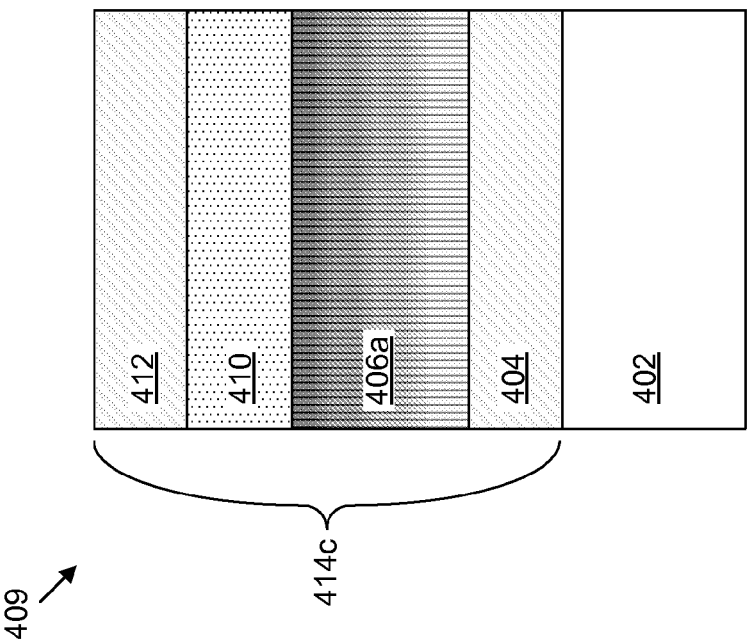

Referring again to FIG. 3B, first an EC layer of $WO_3$ is deposited, see 325. FIGS. 4A-4C are schematic cross-sections depicting formation of electrochromic devices in accord with specific methods and apparatus of the invention, and specifically in accord with process flow 320. Specifically, FIGS. 4A-4C are used to show three non-limiting examples of how an EC layer including $WO_3$ can be formed as part of a stack, wherein an interfacial region serving as an IC layer is formed after the other layers of the stack are deposited. In each of FIGS. 4A-4C, the substrate 402, the first TCO layer 404, the CE layer 410 and the second TCO layer 412 are essentially the same. Also, in each of the three embodiments, a stack is formed without an IC layer, and then the stack is further processed in order to form an interfacial region that serves as an IC layer within the stack, that is between the EC and the CE layer.

Referring to each of FIGS. 4A-4C, layered structures, 400, 403 and 409, respectively are depicted. Each of these layered structures includes a substrate, 402, which is, for example, glass. Any material having suitable optical, electrical, thermal, and mechanical properties may be used as substrate 402. Such substrates include, for example, glass, plastic, and mirror materials. Suitable plastic substrates include, for example acrylic, polystyrene, polycarbonate, allyl diglycol carbonate, SAN (styrene acrylonitrile copolymer), poly(4-methyl-1-pentene), polyester, polyamide, etc. and it is preferable that the plastic be able to withstand high temperature processing conditions. If a plastic substrate is used, it is preferably barrier protected and abrasion protected using a hard coat of, for example, a diamond-like protection coating, a silica/silicone anti-abrasion coating, or the like, such as is well known in the plastic glazing art. Suitable glasses include either clear or tinted soda lime glass, including soda lime float glass. The glass may be tempered or untempered. In some embodiments, commercially available substrates such as glass substrates contain a transparent conductive layer coating. Examples of such glasses include conductive layer coated glasses sold under the trademark TEC Glass™ by Pilkington of Toledo, Ohio, and SUNGATET™ 300 and SUNGATET™ 500 by PPG Industries of Pittsburgh, Pa. TEC Glass™ is a glass coated with a fluorinated tin oxide conductive layer.

In some embodiments, the optical transmittance (i.e., the ratio of transmitted radiation or spectrum to incident radiation or spectrum) of substrate 402 is about 90 to 95%, for example, about 90-92%. The substrate may be of any thickness, as long as it has suitable mechanical properties to support the electrochromic device. While the substrate 402 may be of any size, in some embodiments, it is about 0.01 mm to 10 mm thick, preferably about 3 mm to 9 mm thick.

In some embodiments of the invention, the substrate is architectural glass. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, for example, as large as about 72 inches by 120 inches. Architectural glass is typically at least about 2 mm thick. Architectural glass that is less than about 3.2 mm thick cannot be tempered. In some embodiments of the invention with architectural glass as the substrate, the substrate may still be tempered even after the electrochromic stack has been fabricated on the substrate. In some embodiments with architectural glass as the substrate, the substrate is a soda lime glass from a tin float line. The percent transmission over the visible spectrum of an architectural glass substrate (i.e., the integrated transmission across the visible spectrum) is generally greater than 80% for neutral substrates, but it could be lower for colored substrates. Preferably, the percent transmission of the substrate over the visible spectrum is at least about 90% (for example, about 90-92%). The visible spectrum is the spectrum that a typical human eye will respond to, generally about 380 nm (purple) to about 780 nm (red). In some cases, the glass has a surface roughness of between about 10 nm and about 30 nm. In one embodiment, substrate 402 is soda glass with a sodium diffusion barrier (not shown) to prevent sodium ions from diffusing into the electrochromic device. For the purposes of this description, such an arrangement is referred to as "substrate 402."

Referring again to layered structures, 400, 403 and 409, on top of substrate 402 is deposited a first TCO layer, 404, for example made of fluorinated tin oxide or other suitable material, that is, among other things, conductive and transparent. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like. In one embodiment this second TCO layer is between about 20 nm and about 1200 nm thick, in another embodiment, between about 100 nm and about 600 nm thick, in another embodiment about 350 nm thick. The TCO layer should have an appropriate sheet resistance ($R_s$) because of the relatively large area spanned by the layers. In some embodiments, the sheet resistance of the TCO layers is between about 5 and about 30 Ohms per square. In some embodiments, the sheet resistance of TCO layers is about 15 Ohms per square. In general, it is desirable that the sheet resistance of each of the two conductive layers be about the same. In one embodiment, the two layers, for example 404 and 412, each have a sheet resistance of about 10-15 Ohms per square.

Each of layered structures 400, 403 and 409, include a stack 414a, 414b and 414c, respectively, each of which include the first TCO layer 404 on top of substrate 402, a CE layer 410, and a second TCO layer 412. The difference in each of layered structures 400, 403 and 409 is how the EC layer was formed, which in turn affects the morphology of the resultant interfacial region in each scenario.

Consistent with process flow 325 of FIG. 3B, each of stacks 414a, 414b and 414c include an electrochromic layer deposited on top of the first TCO layer 404. The electrochromic layer may contain any one or more of a number of different electrochromic materials, including metal oxides. Such metal oxides include tungsten oxide ($WO_3$), molybdenum oxide ($MoO_3$), niobium oxide ($Nb_2O_5$), titanium oxide ($TiO_2$), copper oxide (CuO), iridium oxide ($Ir_2O_3$), chromium oxide ($Cr_2O_3$), manganese oxide ($Mn_2O_3$), vanadium oxide ($V_2O_5$), nickel oxide ($Ni_2O_3$), cobalt oxide ($Co_2O_3$) and the like. In some embodiments, the metal oxide is doped with one or more dopants such as lithium, sodium, potassium, molybdenum, niobium, vanadium, titanium, and/or other suitable metals or compounds containing metals. Mixed oxides (for example, W—Mo oxide, W—V oxide) are also used in certain embodiments, that is, the electrochromic layer includes two or more of the aforementioned metal oxides. An electrochromic layer including a metal oxide is capable of receiving ions transferred from a counter electrode layer.

In some embodiments, tungsten oxide or doped tungsten oxide is used for the electrochromic layer. In one embodiment of the invention, the electrochromic layer is made substantially of $WO_x$, where "x" refers to an atomic ratio of oxygen to tungsten in the electrochromic layer, and x is between about 2.7 and 3.5. It has been suggested that only sub-stoichiometric tungsten oxide exhibits electrochromism; i.e., stoichiometric tungsten oxide, $WO_3$, does not exhibit electrochromism. In a more specific embodiment, $WO_x$, where x is less than 3.0 and at least about 2.7 is used for the electrochromic layer. In another embodiment, the electrochromic layer is WOx, where x is between about 2.7 and about 2.9. Techniques such as Rutherford Backscattering Spectroscopy (RBS) can identify the total number of oxygen atoms which include those bonded to tungsten and those not bonded to tungsten. In some instances, tungsten oxide layers where x is 3 or greater exhibit electrochromism, presumably due to unbound excess oxygen along with sub-stoichiometric tungsten oxide. In another embodiment, the tungsten oxide layer has stoichiometric or greater oxygen, where x is 3.0 to about 3.5. In some embodiments of the invention, at least a portion of the EC layer has an excess of oxygen. This more highly oxygenated region of the EC layer is used as a precursor to formation of an ion conducting electron insulating region which serves as an IC layer. In other embodiments a distinct layer of highly oxygenated EC material is formed between the EC layer and the CE layer for ultimate conversion, at least in part, to an ion conducting electrically insulating interfacial region.

In certain embodiments, the tungsten oxide is crystalline, nanocrystalline, or amorphous. In some embodiments, the tungsten oxide is substantially nanocrystalline, with grain sizes, on average, from about 5 nm to 50 nm (or from about 5 nm to 20 nm), as characterized by transmission electron microscopy (TEM). The tungsten oxide morphology or microstructure may also be characterized as nanocrystalline using x-ray diffraction (XRD) and/or electron diffraction, such as selected area electron diffraction (SAED). For example, nanocrystalline electrochromic tungsten oxide may be characterized by the following XRD features: a crystal size of about 10 to 100 nm, for example, about 55 nm. Further, nanocrystalline tungsten oxide may exhibit limited long range order, for example, on the order of several (about 5 to 20) tungsten oxide unit cells.

Thus, for convenience, the remainder of process flow 320, in FIG. 3B, will be further described in relation to a first embodiment, including formation of EC layer 406, represented in FIG. 4A. Then a second and third embodiment, represented in FIGS. 4B and 4C, respectively, will be described thereafter with particular emphasis on formation and morphology and/or microstructure of their respective EC layers.

As mentioned with reference to FIG. 3B, an EC layer is deposited, see 325. In a first embodiment (represented in FIG. 4A), a substantially homogeneous EC layer, 406, including $WO_3$ is formed as part of stack 414a, where the EC layer is in direct contact with a CE layer 410. In one embodiment, the EC layer includes $WO_3$ as described above. In one embodiment, heating is applied during deposition of at least a portion of the $WO_3$. In one particular embodiment, several passes are made past a sputter target, where a portion of the $WO_3$ is deposited on each pass, and heating is applied, for example to substrate 402, after each deposition pass to condition the $WO_3$ prior to deposition of the next portion of $WO_3$ of layer 406. In other embodiments, the $WO_3$ layer may be heated continually during deposition, and deposition can be done in a continuous manner, rather than several passes with a sputter target. In one embodiment, the EC layer is between about 300 nm and about 600 nm thick. As mentioned, the thickness of the EC layer depends on upon the desired outcome and method of forming the IC layer.

In embodiments described in relation to FIG. 4A, the EC layer is $WO_3$, between about 500 nm and about 600 nm thick, that is sputtered using a tungsten target and a sputter gas including between about 40% and about 80% $O_2$ and between about 20% Ar and about 60% Ar, and wherein the substrate upon which the $WO_3$ is deposited is heated, at least intermittently, to between about 150° C. and about 450° C. during formation of the EC layer. In a particular embodiment, the EC layer is $WO_3$, about 550 nm thick, sputtered using the tungsten target, wherein the sputter gas includes about 50% to about 60% $O_2$ and about 40% to about 50% Ar, and the substrate upon which the $WO_3$ is deposited is heated, at least intermittently, to between about 250° C. and about 350° C. during formation of the electrochromic layer. In these embodiments, the $WO_3$ layer is substantially homogenous. In one embodiment, the $WO_3$ is substantially polycrystalline. It is believed that heating the $WO_3$, at least intermittently, during deposition aids in formation of a polycrystalline form of the $WO_3$.

As mentioned, a number of materials are suitable for the EC layer. Generally, in electrochromic materials, the colorization (or change in any optical property—for example, absorbance, reflectance, and transmittance) of the electrochromic material is caused by reversible ion insertion into the material (for example, intercalation) and a corresponding injection of a charge balancing electron. Typically some fraction of the ion responsible for the optical transition is irreversibly bound up in the electrochromic material. As described herein, some or all of the irreversibly bound ions are used to compensate "blind charge" in the material. In most electrochromic materials, suitable ions include lithium ions ($Li^+$) and hydrogen ions ($H^+$) (i.e., protons). In some cases, however, other ions will be suitable. These include, for example, deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena. Intercalation of lithium ions into tungsten oxide ($WO_{3-y}$, ($0<y\leq\sim0.3$)) causes the tungsten oxide to change from transparent (bleached state) to blue (colored state). In a typical process where the EC layer includes or is tungsten oxide, lithium is deposited, for example via sputtering, on EC layer 406 to satisfy the blind charge (as will be discussed in more detail below with reference to FIGS. 6 and 7), see 330 of the process flow in FIG. 3B. In one embodiment, the lithiation is performed in an integrated deposition system where vacuum is not broken between deposition steps. It should be noted that in some embodiments, lithium is not added at this stage, but rather can be added after deposition of the counter electrode layer or in other embodiments lithium is added after the TCO is deposited.

Referring again to FIG. 4A, next a CE layer, 410, is deposited on EC layer 406. In some embodiments, counter electrode layer 410 is inorganic and/or solid. The counter electrode layer may include one or more of a number of different materials that are capable of serving as reservoirs of ions when the electrochromic device is in the bleached state. During an electrochromic transition initiated by, for example, application of an appropriate electric potential, the counter electrode layer transfers some or all of the ions it holds to the electrochromic layer, changing the electrochromic layer to the colored state. Concurrently, in the case of NiO and/or NiWO, the counter electrode layer colors with the loss of ions.

In some embodiments, suitable materials for the counter electrodes include nickel oxide (NiO), nickel tungsten oxide (NiWO), nickel vanadium oxide, nickel chromium oxide, nickel aluminum oxide, nickel manganese oxide, nickel magnesium oxide, chromium oxide ($Cr_2O_3$), manganese oxide ($MnO_2$) and Prussian blue. Optically passive counter electrodes include cerium titanium oxide ($CeO_2$—$TiO_2$), cerium zirconium oxide ($CeO_2$—$ZrO_2$), nickel oxide (NiO), nickel-tungsten oxide (NiWO), vanadium oxide ($V_2O_5$), and mixtures of oxides (for example, a mixture of $Ni_2O_3$ and $WO_3$). Doped formulations of these oxides may also be used, with dopants including, for example, tantalum and tungsten. Because counter electrode layer 410 contains the ions used to produce the electrochromic phenomenon in the electrochromic material when the electrochromic material is in the bleached state, the counter electrode preferably has high transmittance and a neutral color when it holds significant quantities of these ions. The counter electrode morphology may be crystalline, nanocrystalline, or amorphous.

In some embodiments, where the counter electrode layer is nickel-tungsten oxide, the counter electrode material is amorphous or substantially amorphous. Substantially amorphous nickel-tungsten oxide counter electrodes have been found to perform better, under some conditions, in comparison to their crystalline counterparts. The amorphous state of the nickel-tungsten oxide may be obtained though the use of certain processing conditions, described below. While not wishing to be bound to any theory or mechanism, it is believed that amorphous nickel-tungsten oxide is produced by relatively higher energy atoms in the sputtering process. Higher energy atoms are obtained, for example, in a sputtering process with higher target powers, lower chamber pressures (i.e., higher vacuum), and smaller source to substrate distances. Under the described process conditions, higher density films, with better stability under UV/heat exposure are produced.

In certain embodiments, the amount of nickel present in the nickel-tungsten oxide can be up to about 90% by weight of the nickel tungsten oxide. In a specific embodiment, the mass ratio of nickel to tungsten in the nickel tungsten oxide is between about 4:6 and 6:4, in one example, about 1:1. In one embodiment, the NiWO is between about 15% (atomic) Ni and about 60% Ni, and between about 10% W and about 40% W. In another embodiment, the NiWO is between about 30% (atomic) Ni and about 45% Ni, and between about 15% W and about 35% W. In another embodiment, the NiWO is between about 30% (atomic) Ni and about 45% Ni, and between about 20% W and about 30% W. In one embodiment, the NiWO is about 42% (atomic) Ni and about 14% W.

In one embodiment, CE layer 410 is NiWO as described above, see 335 of FIG. 3B. In one embodiment, the CE layer is between about 150 nm and about 300 nm thick, in another embodiment between about 200 nm and about 250 nm thick, in another embodiment about 230 nm thick.

In a typical process, lithium is also applied to the CE layer until the CE layer is bleached. It should be understood that reference to a transition between a colored state and bleached state is non-limiting and suggests only one example, among many, of an electrochromic transition that may be implemented. Unless otherwise specified herein, whenever reference is made to a bleached-colored transition, the corresponding device or process encompasses other optical state transitions such non-reflective-reflective, transparent-opaque, etc. Further the term "bleached" refers to an optically neutral state, for example, uncolored, transparent or translucent. Still further, unless specified otherwise herein, the "color" of an electrochromic transition is not limited to any particular wavelength or range of wavelengths. As understood by those of skill in the art, the choice of appropriate electrochromic and counter electrode materials governs the relevant optical transition.

In a particular embodiment, lithium, for example via sputtering, is added to a NiWO CE layer, see 340 of FIG. 3B. In a particular embodiment, an additional amount of lithium is added after sufficient lithium has been introduced to fully bleach the NiWO, see 345 of FIG. 3B (this process is optional, and in one embodiment excess lithium is not added at this stage in the process). In one embodiment this additional amount is between about 5% and about 15% excess based on the quantity required to bleach the counter electrode layer. In another embodiment, the excess lithium added to the CE layer is about 10% excess based on the quantity required to bleach the counter electrode layer. After CE layer 410 is deposited, bleached with lithium and additional lithium is added, a second TCO layer, 412, is deposited on top of the counter electrode layer, see 350 of FIG. 3B. In one embodiment, the transparent conducting oxide includes indium tin oxide, in another embodiment the TCO layer is indium tin oxide. In one embodiment this second TCO layer is between about 20 nm and about 1200 nm thick, in another embodiment, between about 100 nm and about 600 nm thick, in another embodiment about 350 nm thick.

Referring again to FIG. 4A, once layered structure 400 is complete, it is subjected to thermochemical conditioning which converts at least a portion of stack 414a to an IC layer (if it was not already converted due to lithium diffusion or other mechanism). Stack 414a is a precursor, not an electrochromic device, because it does not yet have an ion conducting/electrically insulating layer (or region) between EC layer 406 and CE layer 410. In this particular embodiment, in a two step process, a portion of EC layer 406 is converted to IC layer 408 to make a functional electrochromic device 401. Referring to FIG. 3B, layered structure 400 is subjected to an MTCC, see 355. In one embodiment, the stack is first subjected to heating, under inert atmosphere (for example argon) at between about 150° C. and about 450° C., for between about 10 minutes and about 30 minutes, and then for between about 1 minutes and about 15 minutes under $O_2$. In another embodiment, the stack is heated at about 250° C., for about 15 minutes under inert atmosphere, and then about 5 minutes under $O_2$. Next, layered structure 400 is subjected to heating in air. In one embodiment the stack is heated in air at between about 250° C. and about 350° C., for between about 20 minutes and about 40 minutes; in another embodiment the stack is heated in air at about 300° C. for about 30 minutes. The energy required to implement MTCC need not be radiant heat energy. For example, in one embodiment ultraviolet radiation is used to implement MTCC. Other sources of energy could also be used without escaping the scope of the invention.

After the multistep thermochemical conditioning, process flow 320 is complete and a functional electrochromic device is created. As mentioned, and while not wishing to be bound by theory, it is believed that the lithium in stack 414a along with a portion of EC layer 406 and/or CE layer 410 combine to form interfacial region 408 which functions as an IC layer. Interfacial region 408 is believed to be primarily lithium tungstate, $Li_2WO_4$, which is known to have good ion conducting and electrically insulating properties relative to traditional IC layer materials. As discussed above, precisely how this phenomenon occurs is not yet known. There are chemical reactions that must take place during the multistep thermochemical conditioning to form the ion conducting electrically insulating region 408 between the EC and CE layers, but also it is thought that an initial flux of lithium traveling through the stack, for example provided by the excess lithium added to the CE layer as described above, plays a part in formation of IC layer 408. The thickness of the ion conducting electronically insulating region may vary depending on the materials employed and process conditions for forming the layer. In some embodiments, interfacial region 408 is about 10 nm to about 150 nm thick, in another embodiment about 20 nm to about 100 nm thick, and in other embodiments between about 30 nm to about 50 nm thick.

As mentioned above, there are a number of suitable materials for making the EC layer. As such, using, for example lithium or other suitable ions, in the methods described above one can make other interfacial regions that function as IC layers starting from oxygen rich EC materials. Suitable EC materials for this purpose include, but are not limited to $SiO_2$, $Nb_2O_5$, $Ta_2O_5$, $TiO_2$, $ZrO_2$ and $CeO_2$. In particular embodiments where lithium ions are used, ion conducting materials such as but not limited to, lithium silicate, lithium aluminum silicate, lithium aluminum borate, lithium aluminum fluoride, lithium borate, lithium nitride, lithium zirconium silicate, lithium niobate, lithium borosilicate, lithium phosphosilicate, and other such lithium-based ceramic materials, silicas, or silicon oxides, including lithium silicon-oxide can be made as interfacial regions that function as IC layers.

As mentioned, in one embodiment, the precursor of the ion conducting region is an oxygen-rich (super-stoichiometric) layer that is transformed into ion-conducting/electron-insulating region via lithiation and MTCC as described herein. While not wishing to be bound to theory, it is believed that upon lithiation, the excess oxygen forms lithium oxide, which further forms lithium salts, that is, lithium electrolytes, such as lithium tungstate ($Li_2WO_4$), lithium molybdate ($Li_2MoO_4$), lithium niobate ($LiNbO_3$), lithium tantalate ($LiTaO_3$), lithium titanate ($Li_2TiO_3$), lithium zirconate ($Li_2ZrO_3$) and the like. In one embodiment, the interfacial region comprises at least one of tungsten oxide ($WO_{3+x}$, $0 \leq x \leq 1.5$), molybdenum oxide ($MoO_{3+x}$, $0 \leq x \leq 1.5$), niobium oxide ($Nb_2O_{5+x}$, $0 \leq x \leq 2$), titanium oxide ($TiO_{2+x}$, $0 \leq x \leq 1.5$), tantalum oxide ($Ta_2O_{5+x}$, $0 \leq x \leq 2$), zirconium oxide ($ZrO_{2+x}$, $0 \leq x \leq 1.5$) and cerium oxide ($CeO_{2+x}$, $0 \leq x \leq 1.5$).

Any material, however, may be used for the ion conducting interfacial region provided it can be fabricated with low defectivity and it allows for the passage of ions between the counter electrode layer 410 to the electrochromic layer 406 while substantially preventing the passage of electrons. The material may be characterized as being substantially conductive to ions and substantially resistive to electrons. In one embodiment, the ion conductor material has an ionic conductivity of between about $10^{-10}$ Siemens/cm (or $ohm^{-1} \, cm^{-1}$) and about $10^{-3}$ Siemens/cm and an electronic resistivity of greater than $10^5$ ohms-cm. In another embodiment, the ion conductor material has an ionic conductivity of between about $10^{-8}$ Siemens/cm and about $10^{-3}$ Siemens/cm and an electronic resistivity of greater than $10^{10}$ ohms-cm. While ion conducting layers should generally resist leakage current (for example, providing a leakage current of not more than about 15 µA/cm², it has been found that some devices fabricated as described herein have surprising high leakage currents, for example, between about 40 µA/cm and about 150 µA/cm, yet provide good color change across the device and operate efficiently.

As mentioned above, there are at least two other ways of creating an ion conducting electrically insulating region between the EC and CE layers, after formation of the stack. These additional embodiments are described below with reference to a particular example where tungsten oxide is used for the EC layer. Also, as mentioned above, the interfacial region with IC properties may form in situ during fabrication of the stack when, for example, lithium diffusion or heat converts some of the EC and/or CE layer to the interfacial region.

In general, there are certain benefits to creating the ion conducting region later in the process. First, the ion conducting material may be protected from some of the harsh processing that occurs during deposition and lithiation of the EC and CE layers. For example, the deposition of these layers by a plasma process is often accompanied by a large voltage drop proximate the stack, frequently in the neighborhood of 15-20 volts. Such large voltages can damage or cause break down of the sensitive ion conducting material. By shifting the IC material formation to later in the process, the material is not exposed to potentially damaging voltage extremes. Second, by forming the IC material later in the process, one may have better control over some process conditions that are not possible prior to completion of both the EC and CE layers. These conditions include lithium diffusion and current flow between electrodes. Controlling these and other conditions late in the process provides additional flexibility to tailor the physical and chemical properties of the IC material to particular applications. Thus, not all of the benefits of the invention are due to the unique interfacial region acting as an IC layer, that is, there are manufacturing and other benefits as well.

It has been observed that ion conducting materials formed in accordance with some of the embodiments described herein have superior performance when compared to devices fabricated using conventional techniques for forming an IC layer (for example, PVD from an IC material target). The device switching speed, for example, has been found to be very fast, for example less than 10 minutes, in one example about eight minutes, to achieve about 80% of end state compared to 20-25 minutes or more for traditional devices. In some instances, devices described herein have switching speeds orders of magnitude better than conventional devices. This is possibly attributable to the greater amounts of readily transferable lithium disposed in the interfacial region and/or the graded interfaces, for example between the EC and interfacial region and/or between the CE and the interfacial region. Such lithium may be in the EC and/or CE phases intermixed with the IC phase present in the interfacial region. It is also due possibly to the relatively thin layer or network of IC material present in the interfacial region. In support of this view, it has been observed that some devices fabricated in accordance with the teachings herein have high leakage currents, yet surprisingly exhibit good color change and good efficiency. In some cases, the leakage current density of solidly performing devices has been found to be at least about 100 µA/cm.

Referring now to FIG. 4B, in a second embodiment, the initially laid down EC material of stack 414b is really two layers: a first $WO_3$ layer, 406, analogous to layer 406 in FIG. 4A, but between about 350 nm and about 450 nm thick, that is sputtered using a tungsten target and a first sputter gas including between about 40% and about 80% $O_2$ and between about 20% Ar and about 60% Ar, and a second $WO_3$ layer, 405, between about 100 nm and about 200 nm thick, that is sputtered using the tungsten target and a second sputter gas including between about 70% and 100% $O_2$ and between 0% Ar and about 30% Ar. In this embodiment, heat is applied, for example by heating substrate 402, at least intermittently, to between about 150° C. and about 450° C. during deposition of the first $WO_3$ layer, 406, but not, or substantially not, heated during deposition of the second $WO_3$ layer 405. In a more specific embodiment, layer 406 is about 400 nm thick and the first sputter gas includes between about 50% and about 60% $O_2$ and between about 40% and about 50% Ar; the second $WO_3$ layer 405 is about 150 nm thick and the second sputter gas is substantially pure $O_2$. In this embodiment, heat is applied, at least intermittently, to between about 200° C. and about 350° C. during formation of the first $WO_3$ layer, 406, but not, or substantially not, heated during formation of the second $WO_3$ layer 405. In this way, the first $WO_3$ layer is substantially polycrystalline, while the second $WO_3$ layer is not necessarily so.

Referring again to FIG. 4B, as described above in relation to FIGS. 3B and 4A, the stack is completed by lithiation of EC layer(s) 406 and 405 to approximately or substantially satisfy the blind charge, deposition of CE layer 410, lithiation of the CE layer to bleach state, addition of additional lithium, and deposition of the second TCO layer 412 to complete layered stack 403. Analogous thermochemical conditioning is performed on layered stack 403 to provide layered stack 407, a functional electrochromic device including an ion conducting electrically insulating region 408a. While not wishing to be bound by theory, in this example, it is believed that the oxygen rich layer 405 of $WO_3$ serves primarily as the source of precursor material to form interfacial region 408a. In this example, the entire oxygen rich $WO_3$ layer is depicted as converting to interfacial region 408a, however it has been found that this is not always the case. In some embodiments, only a portion of an oxygen rich layer is converted to form an interfacial region that serves the function of an IC layer.

Referring now to FIG. 4C, in a third embodiment, layered stack 409 includes an EC layer, 406a, which has a graded composition of $WO_3$ and is formed as part of a stack, 414c, where the graded composition includes varying levels of oxygen. In one non-limiting example, there is a higher concentration of oxygen in EC layer 406a at the EC-CE layer (410) interface than, for example, at the interface of TCO layer 404 with EC layer 406a.

In one embodiment, EC layer 406a is a graded composition $WO_3$ layer, between about 500 nm and about 600 nm thick, that is sputtered using a tungsten target and a sputter gas, wherein the sputter gas includes between about 40% and about 80% $O_2$ and between about 20% Ar and about 60% Ar at the start of sputtering the electrochromic layer, and the sputter gas includes between about 70% and 100% $O_2$ and between 0% Ar and about 30% Ar at the end of sputtering the electrochromic layer, and wherein heat is applied, for example to substrate 402, at least intermittently, to between about 150° C. and about 450° C. at the beginning of formation of EC layer 406a but not, or substantially not, applied during deposition of at least a final portion of EC layer 406a. In a more specific embodiment, the graded composition $WO_3$ layer is about 550 nm thick; the sputter gas includes between about 50% and about 60% $O_2$ and between about 40% and about 50% Ar at the start of sputtering the electrochromic layer, and the sputter gas is substantially pure $O_2$ at the end of sputtering the electrochromic layer; and wherein heat is applied, for example to substrate 402, at least intermittently, to between about 200° C. and about 350° C. at the beginning of formation of the electrochromic layer but not, or substantially not, applied during deposition of at least a final portion of the electrochromic layer. In one embodiment heat is applied at the described temperature ranges at the onset of deposition and gradually decreased to no applied heat at a point where about half of the EC layer is deposited, while the sputter gas composition is adjusted from between about 50% and about 60% $O_2$ and between about 40% and about 50% Ar to substantially pure $O_2$ along a substantially linear rate during deposition of the EC layer.

More generally, the interfacial region typically, though not necessarily, has a heterogeneous structure that includes at least two discrete components represented by different phases and/or compositions. Further, the interfacial region may include a gradient in these two or more discrete components such as an ion conducting material and an electrochromic material (for example, a mixture of lithium tungstate and tungsten oxide). The gradient may provide, for example, a variable composition, microstructure, resistivity, dopant concentration (for example, oxygen concentration), stoichiometry, density, and/or grain size regime. The gradient may have many different forms of transition including a linear transition, a sigmoidal transition, a Gaussian transition, etc. In one example, an electrochromic layer includes a tungsten oxide region that transitions into a superstoichiometric tungsten oxide region. Part or all of the superstoichiometric oxide region is converted to the interfacial region. In the final structure, the tungsten oxide region is substantially polycrystalline and the microstructure transitions to substantially amorphous at the interfacial region. In another example, an electrochromic layer includes a tungsten oxide region that transitions into a niobium (superstoichiometric) oxide region. Part or all of the niobium oxide region is converted to the interfacial region. In the final structure, the tungsten oxide region is substantially polycrystalline and the microstructure transitions to substantially amorphous at the interfacial region.

Referring again to FIG. 4C, as described above in relation to FIGS. 3B and 4A, the stack is completed by lithiation of EC layer 406a to approximately or substantially satisfy the blind charge, deposition of CE layer 410, lithiation of the CE layer to bleach state, addition of additional lithium, and deposition of the second TCO layer 412 to complete layered stack 409. Analogous multistep thermochemical conditioning is performed on layered stack 409 to provide layered stack 411, a functional electrochromic device including an ion conducting electrically insulating region 408b and at least a portion of original graded EC layer 406a which serves as the EC layer in the functional electrochromic device 411. While not wishing to be bound by theory, in this example, it is believed that uppermost oxygen rich portion of the graded layer of $WO_3$ primarily forms graded interfacial region 408b. While not wishing to be bound by theory, there is the possibility that formation of the interfacial region is self-limiting and depends on relative amounts of oxygen, lithium, electrochromic material and/or counter electrode material in the stack.

In various embodiments described herein, the electrochromic stack is described as not, or substantially not, being heated during certain processing phases. In one embodiment, the stack is cooled, actively or passively (for example using a heat sink), after a heating step. Apparatus of the invention include active and passive cooling components, for example, active cooling can include platens that are cooled via fluid circulation, cooling via exposure to cooled (e.g. via expansion) gases, refrigeration units and the like. Passive cooling components can include heat sinks, such as blocks of metal and the like, or simply removing the substrate from exposure to heat.

Another aspect of the invention is a method of fabricating an electrochromic device, the method including: (a) forming either an electrochromic layer including an electrochromic material or a counter electrode layer including a counter electrode material; (b) forming an intermediate layer over the electrochromic layer or the counter electrode layer, where the intermediate layer includes an oxygen rich form of at least one of the electrochromic material, the counter electrode material and an additional material, where the additional material includes distinct electrochromic or counter electrode material, where the intermediate layer is not substantially electronically insulating; (c) forming the other of the electrochromic layer and the counter electrode layer; and (d) allowing at least a portion of the intermediate layer to become substantially electronically insulating. In one embodiment, the electrochromic material is $WO_3$. In another embodiment, (a) includes sputtering $WO_3$ using a tungsten target and a first sputter gas including between about 40% and about 80% $O_2$ and between about 20% Ar and about 60% Ar, to reach of thickness of between about 350 nm and about 450 nm, and heating, at least intermittently, to between about 150° C. and about 450° C. during formation of the electrochromic layer. In another embodiment, (b) includes sputtering $WO_3$ using a tungsten target and a second sputter gas including between about 70% and 100% $O_2$ and between 0% Ar and about 30% Ar, to reach a thickness of between about 100 nm and about 200 nm, without heating. In yet another embodiment, the method further includes sputtering lithium onto the intermediate layer until the blind charge is approximately or substantially satisfied. In one embodiment, the counter electrode layer includes NiWO, between about 150 nm and about 300 nm thick. In another embodiment, lithium is sputtered onto counter electrode layer until the counter electrode layer is bleached. In another embodiment, an additional amount of lithium, between about 5% and about 15% excess based on the quantity required to bleach the counter electrode layer, is sputtered onto the counter electrode layer. In another embodiment, a transparent conducting oxide layer is deposited on top of the counter electrode layer. In one embodiment the transparent conducting oxide includes indium tin oxide, in another embodiment, the transparent conducting oxide is indium tin oxide. In another embodiment, the stack formed from the above embodiments is heated at between about 150° C. and about 450° C., for between about 10 minutes and about 30 minutes under Ar, and then for between about 1 minutes and about 15 minutes under $O_2$, and then heated in air at between about 250° C. and about 350° C., for between about 20 minutes and about 40 minutes.

In another embodiment, (a) includes sputtering a first electrochromic material of formula $MO_x$, wherein M is a metal or metalloid element and x indicates stoichiometric oxygen to M ratio, and (b) includes sputtering a second electrochromic material of formula $NO_y$ as the intermediate layer, where N is the same or a different metal or metalloid element and y indicates a superstoichiometric amount of oxygen to N ratio. In one embodiment, M is tungsten and N is tungsten. In another embodiment, M is tungsten and N is selected from the group consisting of niobium, silicon, tantalum, titanium, zirconium and cerium.

Another embodiment of the invention is an electrochromic device including: (a) an electrochromic layer including an electrochromic material; (b) a counter electrode layer including a counter electrode material; and (c) an interfacial region between the electrochromic layer and the counter electrode layer, wherein the interfacial region includes an electronically insulating ion conducting material and at least one of the electrochromic material, the counter electrode material and an additional material, where the additional material includes distinct electrochromic or counter electrode material.

In one embodiment, the electronically insulating ion conducting material and at least one of the electrochromic material, the counter electrode material and the additional material are substantially evenly distributed within the interfacial region. In another embodiment, the electronically insulating ion conducting material and at least one of the electrochromic material, the counter electrode material and the additional material include a composition gradient in a direction perpendicular to the layers. In another embodiment, consistent with either of the two aforementioned embodiments, the electronically insulating ion conducting material includes lithium tungstate, the electrochromic material includes a tungsten oxide and the counter electrode material includes nickel tungsten oxide. In a specific implementation of the aforementioned embodiment, there is no additional material. In one embodiment, the electrochromic layer is between about 300 nm and about 500 nm thick, the interfacial region is between about 10 nm and about 150 nm thick, and the counter electrode layer is between about 150 nm and about 300 nm thick. In another embodiment, the electrochromic layer is between about 400 nm and about 500 nm thick; the interfacial region is between about 20 nm and about 100 nm thick, and the counter electrode layer is between about 150 and about 250 nm thick. In yet another embodiment, the electrochromic layer is between about 400 nm and about 450 nm thick; the interfacial region is between about 30 nm and about 50 nm thick, and the counter electrode layer is about 200 nm and about 250 nm thick.

Another embodiment is a method of fabricating an electrochromic device, the method including:
  depositing an electrochromic layer by sputtering a tungsten target with a sputter gas comprising between about 40% and about 80% $O_2$ and between about 20% Ar and about 60% Ar to produce $WO_3$ to a thickness of between about 500 nm and about 600 nm, wherein the substrate upon which the $WO_3$ is deposited is heated, at least intermittently, to between about 150° C. and about 450° C. during formation of the electrochromic layer;
  sputtering lithium onto the electrochromic layer until the blind charge is satisfied;
  depositing a counter electrode layer on the electrochromic layer without first providing an ion conducting electronically insulating layer between the electrochromic layer and the counter electrode layer, wherein the counter electrode layer includes NiWO;
  sputtering lithium onto the counter electrode layer until the counter electrode layer is substantially bleached; and
  forming an interfacial region between the electrochromic layer and the counter electrode layer, wherein said interfacial region is substantially ion conducting and substantially electronically insulating. In one embodiment, forming the interfacial region includes MTCC of the stack, alone or along with substrate, conductive and/or encapsulation layers.

The electrochromic devices of the invention can include one or more additional layers (not shown) such as one or more passive layers, for example to improve certain optical properties, providing moisture or scratch resistance, to hermetically seal the electrochromic device and the like. Typically, but not necessarily, a capping layer is deposited on the electrochromic stack. In some embodiments, the capping layer is SiAlO. In some embodiments, the capping layer is deposited by sputtering. In one embodiment, the thickness of a capping layer is between about 30 nm and about 100 nm.

From the discussion above, it should be appreciated that electrochromic devices of the invention can be made in a single chamber apparatus, for example a sputter tool, that has, for example, a tungsten target, a nickel target and a lithium target along with oxygen and argon sputter gases. As mentioned, due to the nature of the interfacial regions formed to serve the purpose of a conventional distinct IC layer, a separate target for sputtering an IC layer is not necessary. Of particular interest to the inventors is fabricating electrochromic devices of the invention, for example, in a high throughput fashion, therefore it is desirable to have apparatus that can fabricate electrochromic devices of the invention sequentially as substrates pass through an integrated deposition system. For example, the inventors are particularly interested in fabricating electrochromic devices on windows, particularly architectural glass scale windows (supra).

Thus, another aspect of the invention is an apparatus for fabricating an electrochromic device, including: an integrated deposition system including: (i) a first deposition station containing a material source configured to deposit an electrochromic layer including an electrochromic material; and (ii) a second deposition station configured to deposit a counter electrode layer including a counter electrode material; and a controller containing program instructions for passing the substrate through the first and second deposition stations in a manner that sequentially deposits a stack on the substrate, the stack having an intermediate layer sandwiched in between the electrochromic layer and the counter electrode layer; wherein either or both of the first deposition station and the second deposition station are also configured to deposit the intermediate layer over the electrochromic layer or the counter electrode layer, and where the intermediate layer includes an oxygen rich form of the electrochromic material or the counter electrode material and where the first and second deposition stations are interconnected in series and operable to pass a substrate from one station to the next without exposing the substrate to an external environment. In one embodiment, apparatus of the invention are operable to pass the substrate from one station to the next without breaking vacuum and may include one or more lithiation stations operable to deposit lithium from a lithium-containing material source on one or more layers of the electrochromic device. In one embodiment, apparatus of the invention are operable to deposit the electrochromic stack on an architectural glass substrate.

In one embodiment, the apparatus is operable to pass the substrate from one station to the next without breaking vacuum. In another embodiment, the integrated deposition system further includes one or more lithiation stations operable to deposit lithium from a lithium-containing material source on at least one of the electrochromic layer, the intermediate layer and the counter electrode layer. In yet another embodiment, the integrated deposition system is operable to deposit the stack on an architectural glass substrate. In another embodiment, the integrated deposition system further includes a substrate holder and transport mechanism operable to hold the architectural glass substrate in a vertical orientation while passing through the integrated deposition system. In another embodiment, the apparatus further includes one or more load locks for passing the substrate between an external environment and the integrated deposition system. In another embodiment, the apparatus further includes at least one slit valve operable to permit isolation of said one or more lithium deposition stations from at least one of the first deposition station and the second deposition station. In one embodiment, the integrated deposition system includes one or more heaters configured to heat the substrate.

Figure 5:
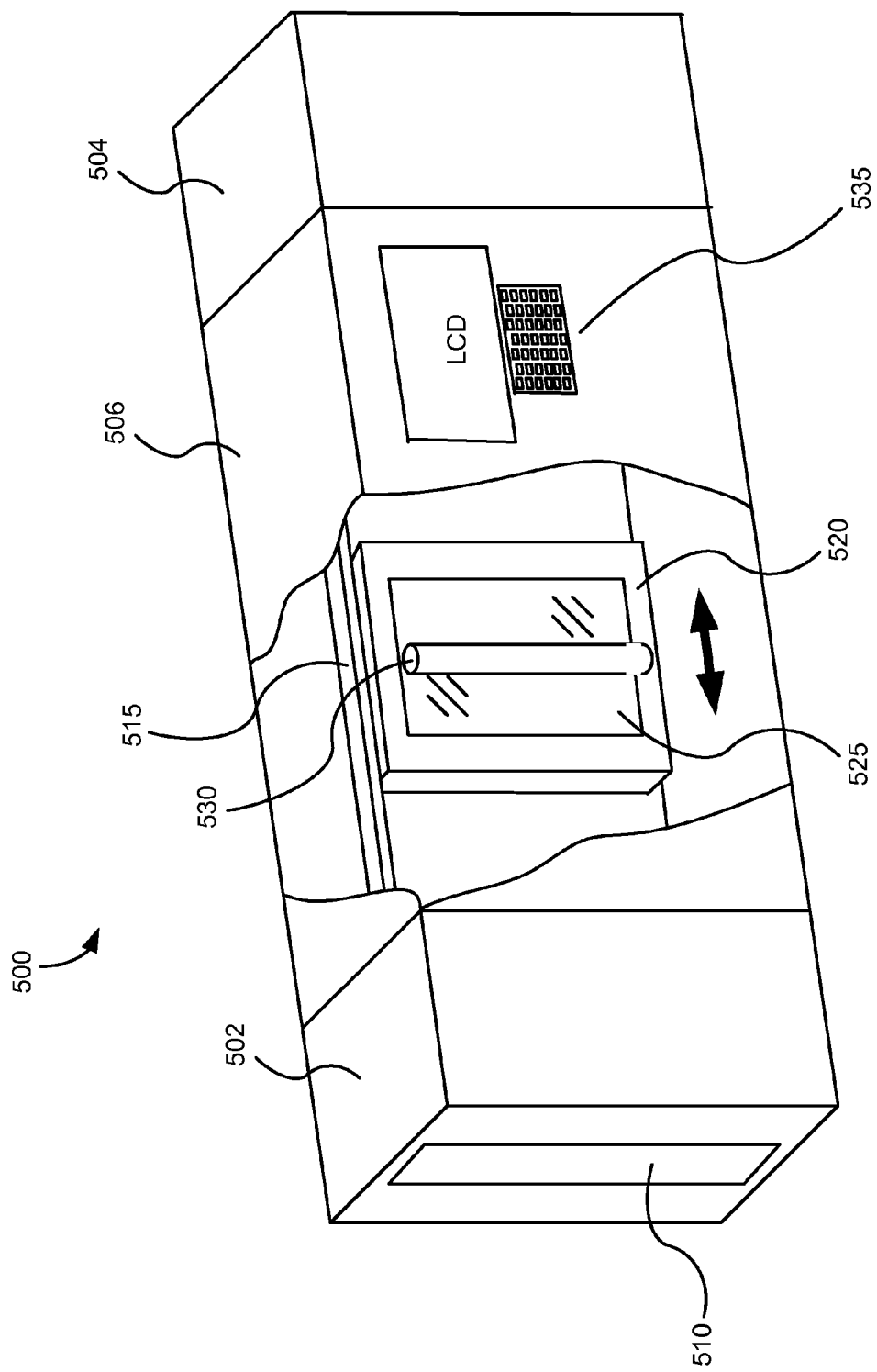
FIG. 5 depicts an integrated deposition system of the invention in a perspective view.

FIG. 5 depicts a simplified representation of an integrated deposition system 500 in a perspective view and with more detail including a cutaway view of the interior. In this example, system 500 is modular, where entry load lock 502 and exit load lock 504 are connected to deposition module 506. There is an entry port, 510, for loading, for example, architectural glass substrate 525 (load lock 504 has a corresponding exit port). Substrate 525 is supported by a pallet, 520, which travels along a track, 515. In this example, pallet 520 is supported by track 515 via hanging but pallet 520 could also be supported atop a track located near the bottom of apparatus 500 or a track, for example mid-way between top and bottom of apparatus 500. Pallet 520 can translate (as indicated by the double headed arrow) forward and/or backward through system 500. For example during lithium deposition, the substrate may be moved forward and backward in front of a lithium target, 530, making multiple passes in order to achieve a desired lithiation. This function is not limited to lithium targets, however, for example a tungsten target may pass multiple times past a substrate, or the substrate may pass by via forward/backward motion path in front of the tungsten target to deposit, for example, an electrochromic layer. Pallet 520 and substrate 525 are in a substantially vertical orientation. A substantially vertical orientation is not limiting, but it may help to prevent defects because particulate matter that may be generated, for example, from agglomeration of atoms from sputtering, will tend to succumb to gravity and therefore not deposit on substrate 525. Also, because architectural glass substrates tend to be large, a vertical orientation of the substrate as it traverses the stations of the integrated deposition system enables coating of thinner glass substrates since there are less concerns over sag that occurs with thicker hot glass.

Target 530, in this case a cylindrical target, is oriented substantially parallel to and in front of the substrate surface where deposition is to take place (for convenience, other sputter means are not depicted here). Substrate 525 can translate past target 530 during deposition and/or target 530 can move in front of substrate 525. The movement path of target 530 is not limited to translation along the path of substrate 525. Target 530 may rotate along an axis through its length, translate along the path of the substrate (forward and/or backward), translate along a path perpendicular to the path of the substrate, move in a circular path in a plane parallel to substrate 525, etc. Target 530 need not be cylindrical, it can be planar or any shape necessary for deposition of the desired layer with the desired properties. Also, there may be more than one target in each deposition station and/or targets may move from station to station depending on the desired process. The various stations of an integrated deposition system of the invention may be modular, but once connected, form a continuous system where a controlled ambient environment is established and maintained in order to process substrates at the various stations within the system.

More detailed aspects of how electrochromic materials are deposited using integrated deposition system 500 are described in US Non-Provisional patent application Ser. Nos. 12/645,111 and 12/645,159, supra.

Integrated deposition system 500 also has various vacuum pumps, gas inlets, pressure sensors and the like that establish and maintain a controlled ambient environment within the system. These components are not shown, but rather would be appreciated by one of ordinary skill in the art. System 500 is controlled, for example, via a computer system or other controller, represented in FIG. 5 by an LCD and keyboard, 535. One of ordinary skill in the art would appreciate that embodiments of the present invention may employ various processes involving data stored in or transferred through one or more computer systems. Embodiments of the present invention also relate to the apparatus, such computers and microcontrollers, for performing these operations. These apparatus and processes may be employed to deposit electrochromic materials of methods of the invention and apparatus designed to implement them. The control apparatus of this invention may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method and processes.

From the description above, particularly of FIGS. 3A and 3B, it can be seen that with methods of the invention, one can not only make electrochromic devices, but also prefabricate a layered stack, for example 400, 403 and 409, that can in some cases be converted through subsequent processing, for example as described herein, to an electrochromic device. Though not functional electrochromic devices, by virtue of not having an ion conducting and electrically insulating region between the EC and CE layers, such "electrochromic device precursors" can be of particular value. This is especially true if the device precursors are manufactured in a high purity, integrated processing apparatus as described herein, where the material layers are all deposited under a controlled ambient environment where, for example, vacuum is never broken. In that way, high purity, low-defect materials are stacked and essentially "sealed," for example, by the final TCO layer and/or a capping layer prior to leaving the integrated system.

Like the electrochromic devices of the invention described above, electrochromic device precursors can also include one or more additional layers (not shown) such as one or more passive layers, for example to improve certain optical properties, providing moisture or scratch resistance, to hermetically seal the device precursor and the like. In one embodiment, a capping layer is deposited on the TCO layer of the precursor stack. In some embodiments, the capping layer is SiAlO. In some embodiments, the capping layer is deposited by sputtering. In one embodiment, the thickness of a capping layer is between about 30 nm and about 100 nm. Subsequent processing with the cap layer in place forms the IC layer without contamination from the environment, that is, with the additional protection of the capping layer.

Conversion to the functional electrochromic device can occur outside the integrated system if desired, since the internal stack structure is protected from the outside environment and somewhat less stringent purity conditions are necessary for the last conditioning steps to convert the precursor stack to the functional device. Such stacked electrochromic device precursors can have advantages, for example, longer lifespan due to conversion to the electrochromic device only when needed, flexibility by having, for example, a single precursor stack that can be stored and used when conversion parameters are improved or fed to different conversion chambers and/or customer sites for conversion depending on the needs of the final product and quality standards that must be met. Also such precursor stacks are useful for testing purposes, for example, quality control or research efforts.

Accordingly, one embodiment of the invention is an electrochromic device precursor including: (a) a substrate; (b) a first transparent conducting oxide layer on the substrate; (c) a stack on the first transparent conducting oxide layer, the stack including: (i) an electrochromic layer including an electrochromic material, and (ii) a counter electrode layer including a counter electrode material; where the stack does not include an ion conducting and electrically insulating region between the electrochromic layer and the counter electrode layer; and (d) a second transparent conducting oxide layer on top of the stack. In one embodiment, the electrochromic layer includes tungsten oxide and the counter electrode layer comprises nickel tungsten oxide. In one embodiment, at least one of the stack and the electrochromic layer contain lithium. In another embodiment, the electrochromic layer is tungsten oxide with a superstoichiometric oxygen content at least at the interface with the counter electrode layer. In another embodiment, the stack includes an IC precursor layer between the counter electrode layer and the electrochromic layer, the IC precursor layer including tungsten oxide with a higher oxygen content than that of the electrochromic layer. In one embodiment, where there is no IC precursor layer between the EC and CE layers, the electrochromic layer is between about 500 nm and about 600 nm thick and the counter electrode layer is between about 150 nm and about 300 nm thick. In another embodiment, where there is an IC precursor layer between the EC and CE layers, the electrochromic layer is between about 350 nm and about 400 nm thick, the IC precursor layer is between about 20 nm and about 100 nm thick, and the counter electrode layer is between about 150 nm and about 300 nm thick. In one embodiment, precursor devices described herein are exposed to heating to convert them to functional electrochromic devices. In one embodiment, the heating is part of an MTCC.

Another embodiment is an electrochromic device including: (a) an electrochromic layer including an electrochromic material, and (b) a counter electrode layer including a counter electrode material, wherein the device does not contain a compositionally homogeneous layer of electrically insulating, ion conducting material between the electrochromic layer and the counter electrode layer. In one embodiment, the electrochromic material is tungsten oxide, the counter electrode material is nickel tungsten oxide, and between the electrochromic layer and the counter electrode layer is an interfacial region including a mixture of lithium tungstate and at least one of tungsten oxide and nickel tungsten oxide. In another embodiment, the electrochromic layer is between about 300 nm and about 500 nm thick; the interfacial region is between about 10 nm and about 150 nm thick, and the counter electrode layer is between about 150 nm and about 300 nm thick.

EXAMPLES

Figure 6:
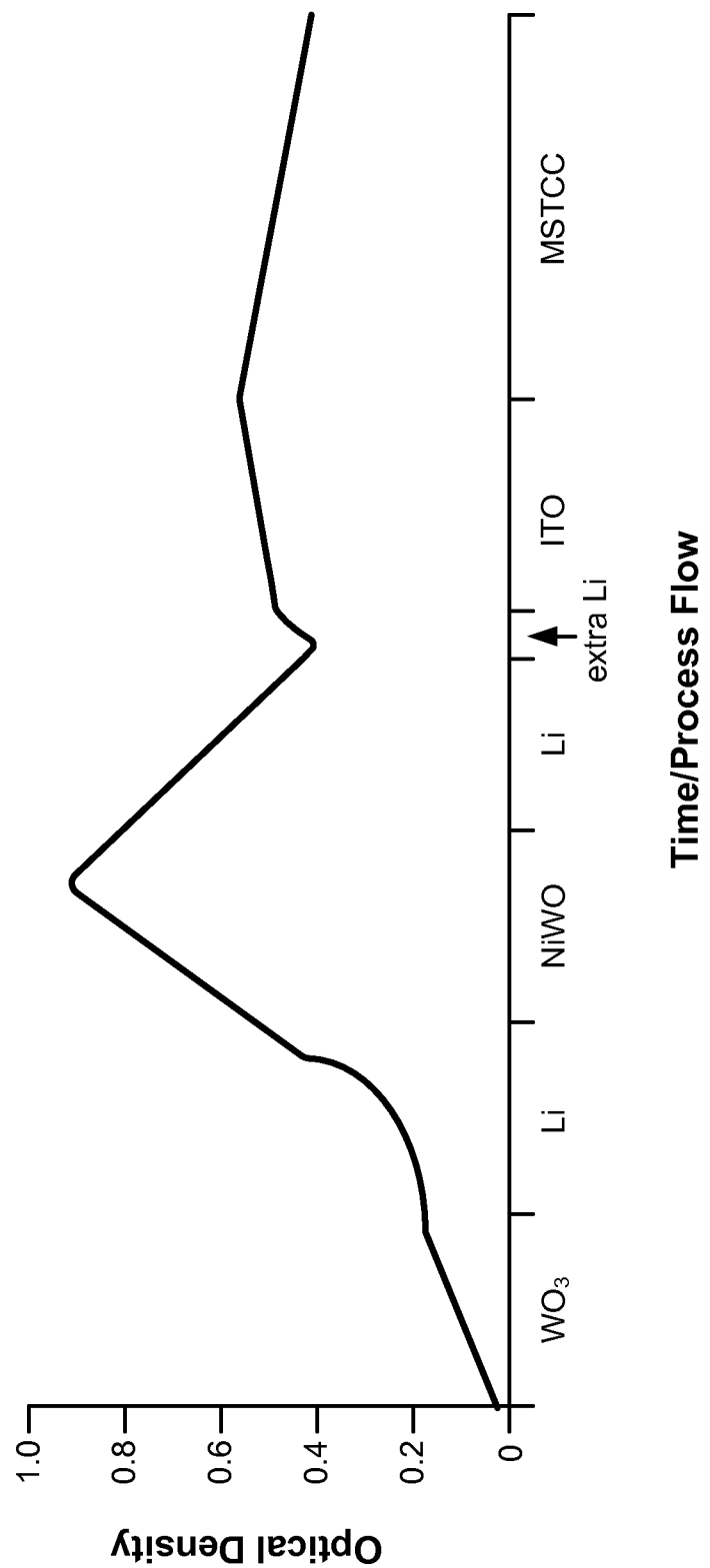
FIG. 6 is a graph showing how process parameters and endpoint readouts correlate during formation of an electrochromic stack in accord with embodiments of the invention.

FIG. 6, is a graph of a process flow used as a protocol for fabricating electrochromic devices of the invention. They axis units are optical density and the x axis units are time/process flow. In this example, an electrochromic device is fabricated analogous to that described in relation to FIG. 4A, where the substrate is glass with fluorinated tin oxide as the first TCO, the EC layer is $WO_3$ with excess oxygen in the matrix (for example, sputtered using the tungsten target, where the sputter gas is about 60% $O_2$ and about 40% Ar), the CE layer is formed atop the EC layer and is made of NiWO and the second TCO is indium tin oxide (ITO). Lithium is used as the ion source for the electrochromic transition.

Optical density is used to determine endpoints during fabrication of the electrochromic device. Starting at the origin of the graph, optical density is measured as the EC layer, $WO_3$, is deposited on the substrate (glass+TCO). The optical density of the glass substrate has a baseline value optical density of about 0.07 (absorbance units). The optical density increases from that point as the EC layer builds, because tungsten oxide, although substantially transparent, absorbs some visible light. For a desired thickness of the tungsten oxide layer about 550 nm thick, as described above, the optical density rises to about 0.2. After deposition of the tungsten oxide EC layer, lithium is sputtered on the EC layer as indicated by the first time period denoted "Li." During this period, the optical density increases along a curve further to about 0.4, indicating that the blind charge of the tungsten oxide has been satisfied, as tungsten oxide colors as lithium is added. The time period denoted "NiWO" indicates deposition of the NiWO layer, during which the optical density increases because NiWO is colored. The optical density increases further during NiWO deposition from about 0.4 to about 0.9 for the addition of a NiWO layer about 230 nm thick. Note that some lithium may diffuse from the EC layer to the CE layer as the NiWO is deposited. This serves to maintain the optical density at a relatively lower value during the NiWO deposition, or at least during the initial phase of the deposition.

The second time period denoted "Li" indicates addition of lithium to the NiWO EC layer. The optical density decreases from about 0.9 to about 0.4 during this phase because lithiation of the NiWO bleaches the NiWO. Lithiation is carried out until the NiWO is bleached, including a local minima at about 0.4 optical density. The optical density bottoms out at about 0.4 because the $WO_3$ layer is still lithiated and accounts for the optical density. Next, as indicated by time period "extra Li" additional lithium is sputtered onto the NiWO layer, in this example about 10% additional lithium as compared to that added to the NiWO to bleach it. During this phase the optical density increases slightly. Next the indium tin oxide TCO is added, as indicated by "ITO" in the graph. Again, the optical density continues to rise slightly during formation of the indium tin oxide layer, to about 0.6. Next, as indicated by time period denoted "MSTCC" the device is heated to about 250° C., for about 15 minutes under Ar, and then about 5 minutes under $O_2$. Then the device is annealed in air at about 300° C. for about 30 minutes. During this time, the optical density decreases to about 0.4. Thus optical density is a useful tool for fabricating devices of the invention, for example for determining layer thickness based on material deposited and morphology, and especially for titrating lithium onto the various layers for satisfying blind charge and/or reaching a bleached state.

FIG. 7 shows a cross section TEM of an electrochromic device 700 fabricated using methods of the invention, consistent with the protocol as described in relation to FIG. 6. Device 700 has a glass substrate 702 upon which an electrochromic stack, 714, is formed. Substrate 702 has an ITO layer, 704, which serves as the first TCO. A tungsten oxide EC layer, 706, is deposited on TCO 704. Layer 706 was formed at a thickness of about 550 nm, that is, $WO_3$ formed via sputtering tungsten with oxygen and argon as described above in relation to FIG. 6. To the EC layer was added lithium. Then a CE layer, 710, of NiWO, about 230 nm thick, was added followed by addition of lithium to bleach and then about 10% excess. Finally an indium tin oxide layer, 712, was deposited and the stack was subjected to multistep thermochemical conditioning as described above in relation to FIG. 4A. After the MSTCC, this TEM was taken. As seen, a new region, 708, which is ion conducting electronically insulating, was formed.

FIG. 7 also shows five selected area electron diffraction (SAED) patterns for the various layers. First, 704a, indicates that the ITO layer is highly crystalline. Pattern 706a shows that the EC layer is polycrystalline. Pattern 708a shows that the IC layer is substantially amorphous. Pattern 710a shows that the CE layer is polycrystalline. Finally, pattern 712a shows that the indium tin oxide TCO layer is highly crystalline.

Figure 8A:
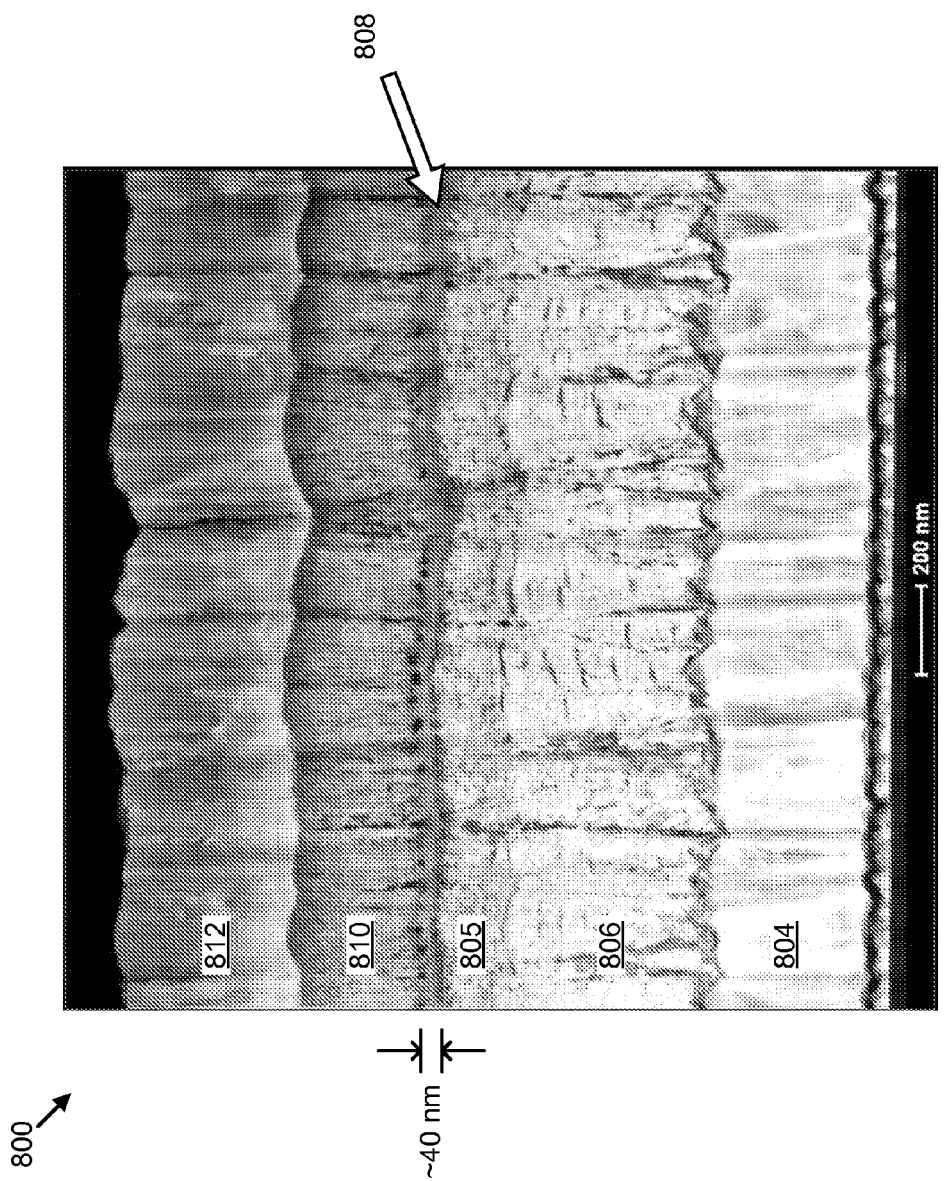

FIG. 8 is a cross section of a device, 800, of the invention analyzed by scanning transmission electron microscopy (STEM). In this example, device 800 was fabricated using methods of the invention, consistent with the protocol as described in relation to FIG. 4B. Device 800 is an electrochromic stack formed on a glass substrate (not labeled). On the glass substrate is a fluorinated tin oxide layer, 804, which serves as the first TCO (sometimes called a "TEC" layer, for transparent electronic conductor"). A tungsten oxide EC layer, 806, was deposited on TCO 804. In this example, layer 806 was formed at a thickness of about 400 nm, that is, $WO_3$ formed via sputtering tungsten with oxygen and argon as described above in relation to FIG. 6, then an oxygen rich precursor layer, 805, was deposited to a thickness of about 150 nm. To layer 805 was added lithium. Then a CE layer, 810, of NiWO, about 230 nm thick, was added followed by addition of lithium to bleach and then about 10% excess. Finally an indium tin oxide layer, 812, was deposited and the stack was subjected to multistep thermochemical conditioning as described above in relation to FIG. 4B. After the MSTCC, this STEM was taken. As seen, a new region, 808, which is ion conducting electronically insulating, was formed. The difference between this example and the embodiment described in relation to FIG. 4B, is that here the oxygen rich layer 805, unlike analogous layer 405 in FIG. 4B, was only partially converted to the interfacial region 808. In this case only about 40 nm of the 150 nm of oxygen rich precursor layer 405 was converted to the region serving as the ion conducting layer.

Figure 8C:
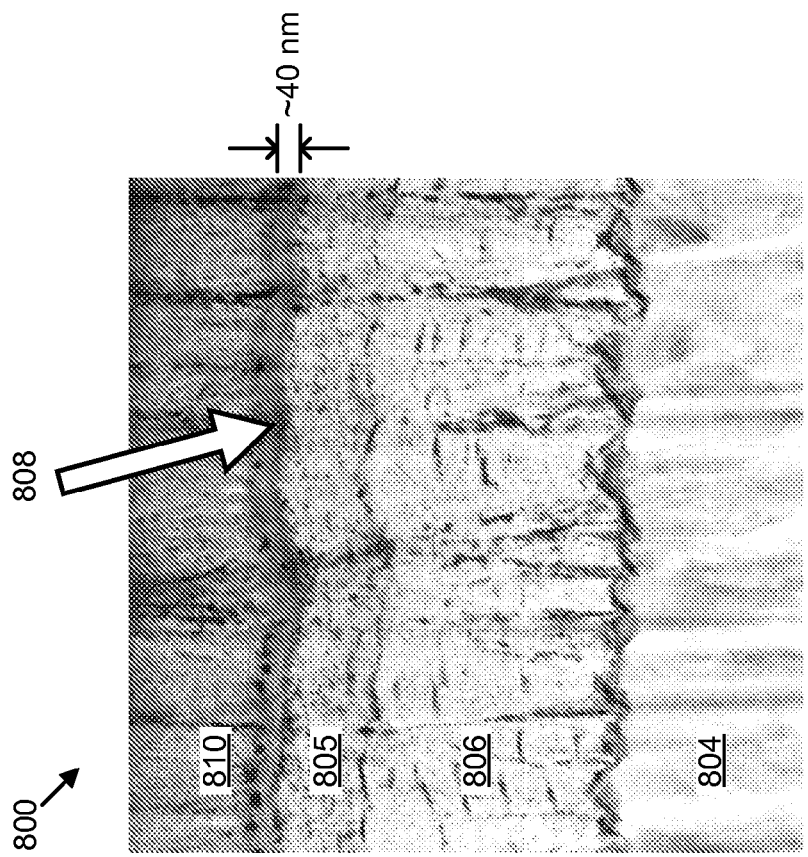
Figure 8B:
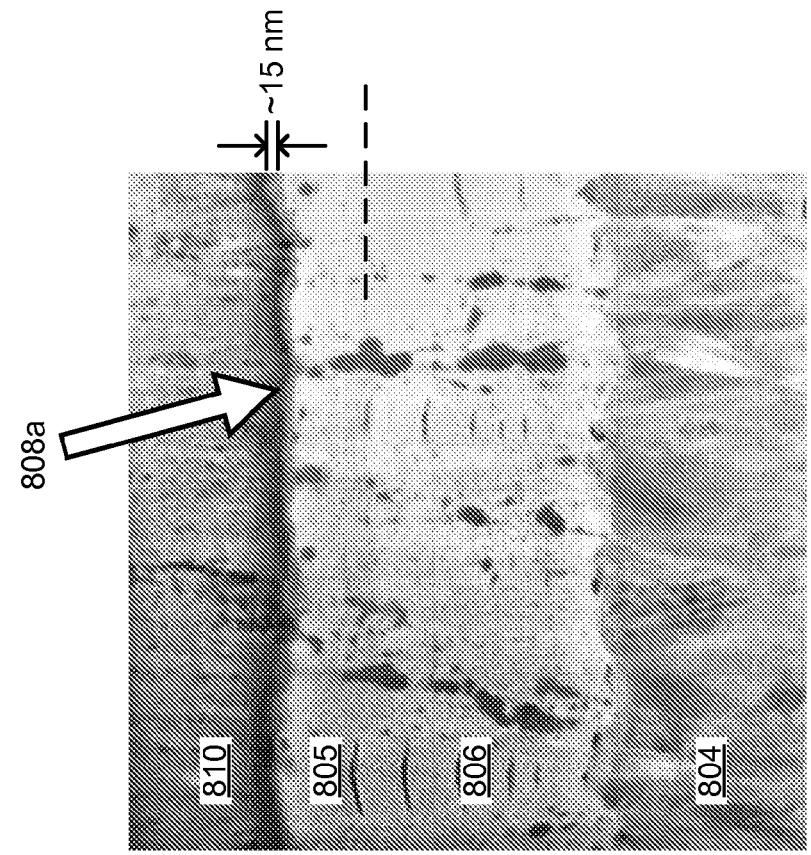

FIGS. 8B and 8C show a "before and after" comparison of device, 800, of the invention (FIG. 8C) and the device precursor (FIG. 8B) before multistep thermochemical conditioning as analyzed by STEM. In this example, only layers 804-810, EC through CE, are depicted. The layers are numbered the same as in FIG. 8A, with a few exceptions. The dotted line in FIG. 8B is used to approximately demark the interface of EC layer 806 and oxygen rich layer 805 (this is more clear in FIG. 8C). Referring again to FIG. 8B, it appears that at least there is lithium, as indicated by 808a, concentrated (approximately 10-15 nm thick region) at the interface of oxygen rich layer 805 and CE layer 810. After MTCC, FIG. 8C, it is clear that interfacial region 808 has formed.

Although the foregoing invention has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. An apparatus for fabricating an electrochromic device, comprising:
    (a) an integrated deposition system comprising:
        (i) a first deposition station containing a first target comprising a first material for depositing a layer of an electrochromic material on a substrate when the substrate is positioned in the first deposition station, wherein the layer of electrochromic material is configured to function as a first electrochromic electrode of the electrochromic device, and
        (ii) a second deposition station containing a second target comprising a second material for depositing a layer of a counter electrode material on the substrate when the substrate is positioned in the second deposition station, wherein the layer of counter electrode material is configured to function as a second electrochromic electrode of the electrochromic device; and
    (b) a controller containing program instructions provided on a non-transitory, tangible medium for passing the substrate through the first and second deposition stations in a manner that sequentially deposits a stack on the substrate, the stack comprising the layer of electrochromic material in direct contact with the layer of counter electrode material, without an ion conductor layer between the layer of electrochromic material and the layer of counter electrode material.

2. The apparatus of claim 1, operable to pass the substrate from one station to the next without breaking vacuum.

3. The apparatus of claim 1, wherein the integrated deposition system further comprises one or more lithiation stations operable to deposit lithium from a lithium-containing material source on at least one of the electrochromic layer and the counter electrode layer.

4. The apparatus of claim 3, further comprising at least one slit valve operable to permit isolation of said one or more lithiation stations from at least one of the first deposition station and the second deposition station.

5. The apparatus of claim 3, wherein the controller further comprises instructions for depositing both the layer of electrochromic material and the layer of counter electrode material and lithiating both of said layers.

6. The apparatus of claim 5, wherein the controller instructions comprise instructions for depositing the layer of electrochromic material before depositing the layer of counter electrode material.

7. The apparatus of claim 3, wherein the controller further comprises instructions for depositing lithium from the lithium-containing material source on the first deposited one of the electrochromic layer and the counter electrode layer.

8. The apparatus of claim 7, wherein the controller further comprises instructions for (i) depositing the second deposited one of the electrochromic layer and the counter electrode layer after depositing the lithium, and then (ii) depositing lithium on the second deposited one of the electrochromic layer and the counter electrode layer.

9. The apparatus of claim 3, wherein the controller further comprises instructions for depositing lithium from the lithium-containing material source on the second deposited one of the electrochromic layer and the counter electrode layer.

10. The apparatus of claim 1, wherein the integrated deposition system is operable to deposit the stack on an architectural glass substrate.

11. The apparatus of claim 1, wherein the integrated deposition system further comprises a substrate holder and transport mechanism configured to hold the substrate in a substantially vertical orientation while passing through the integrated deposition system.

12. The apparatus of claim 11, wherein the substrate holder and transport mechanism are configured to hold an architectural glass substrate.

13. The apparatus of claim 11, wherein the substrate holder and transport mechanism are configured to move substrate in a forward and backward motion path in front of the first target and/or the second target during deposition of the layer of electrochromic material and/or the layer of counter electrode material.

14. The apparatus of claim 1, further comprising one or more load locks for passing the substrate between an external environment and the integrated deposition system.

15. The apparatus of claim 1, wherein the integrated deposition system comprises one or more heaters configured to heat the substrate and one or more cooling components configured to cool, actively or passively, the substrate.

16. The apparatus of claim 1, wherein the integrated deposition system does not contain a separate target comprising material for an ion conductor layer.

17. The apparatus of claim 1, wherein the apparatus does not have a separate station for depositing an ion conductor layer between the layer of electrochromic material and the layer of counter electrode material.

18. The apparatus of claim 1, wherein the first deposition station is adjacent to the second deposition station.

19. The apparatus of claim 1, wherein the first and second deposition stations are provided in a single chamber.

20. The apparatus of claim 1, wherein the first target comprises tungsten and the second target comprises nickel.

21. The apparatus of claim 1, wherein the layer of counter electrode material comprises a doped nickel oxide.

22. The apparatus of claim 21, wherein the doped nickel oxide comprises tungsten doped nickel oxide.

23. The apparatus of claim 21, wherein the doped nickel oxide comprises tantalum doped nickel oxide.

24. The apparatus of claim 1, wherein the layer of counter electrode material comprises a material selected from the group consisting of nickel oxide, nickel tungsten oxide, nickel vanadium oxide, nickel chromium oxide, nickel aluminum oxide, nickel manganese oxide, nickel magnesium oxide, chromium oxide, manganese oxide, and Prussian blue.

25. The apparatus of claim 1, wherein the first deposition station and the second deposition station are connected modules.

26. The apparatus of claim 1, wherein the stack comprises a transparent conductive oxide.

27. An apparatus for fabricating an electrochromic device, comprising: an integrated deposition system comprising:
(i) a first deposition station containing a material source configured to deposit an electrochromic layer including an electrochromic material;
(ii) a second deposition station configured to deposit a counter electrode layer including a counter electrode material; and
(iii) a controller containing program instructions provided on a non-transitory, tangible medium for passing the substrate through the first and second deposition stations in a manner that sequentially deposits a stack on the substrate, the stack comprising an intermediate layer sandwiched in between the electrochromic layer and the counter electrode layer; the intermediate layer not substantially electronically insulating; wherein either or both of the first deposition station and the second deposition station are also configured to deposit the intermediate layer over the electrochromic layer or the counter electrode layer, and where the intermediate layer includes an oxygen rich form of the electrochromic material or the counter electrode material and where the first and second deposition stations are interconnected in series and operable to pass a substrate from one station to the next without exposing the substrate to an external environment.

28. The apparatus of claim 27, operable to pass the substrate from one station to the next without breaking vacuum.

29. The apparatus of claim 28, wherein the integrated deposition system further comprises one or more lithiation stations operable to deposit lithium from a lithium-containing material source on at least one of the electrochromic layer, the intermediate layer and the counter electrode layer.

30. The apparatus of claim 29, wherein the controller and deposition stations are configured to sequentially deposit the electrochromic layer, then the intermediate layer, and then the counter electrode layer.

31. The apparatus of claim 30, wherein the controller further comprises program instructions for depositing lithium onto the electrochromic layer or the intermediate layer prior to depositing the counter electrode.

32. The apparatus of claim 30, wherein the controller further comprises program instructions for depositing lithium onto the counter electrode.

33. The apparatus of claim 29, further comprising one or more load locks for passing the substrate between an external environment and the integrated deposition system.

34. The apparatus of claim 33, further comprising at least one slit valve operable to permit isolation of said one or more lithium deposition stations from at least one of the first deposition station, the second deposition station and the third deposition station.

35. The apparatus of claim 27, wherein the integrated deposition system is operable to deposit the stack on an architectural glass substrate.

36. The apparatus of claim 35, wherein the integrated deposition system further comprises a substrate holder and transport mechanism operable to hold the architectural glass substrate in a substantially vertical orientation while passing through the integrated deposition system.

37. The apparatus of claim 27, wherein the integrated deposition system comprises one or more heaters configured to heat the substrate and one or more cooling components configured to cool the substrate.

* * * * *